United States Patent
Gladwin et al.

(10) Patent No.: US 9,681,156 B2
(45) Date of Patent: Jun. 13, 2017

(54) MEDIA DISTRIBUTION TO A PLURALITY OF DEVICES UTILIZING BUFFERED DISPERSED STORAGE

(71) Applicant: CLEVERSAFE, INC., Chicago, IL (US)

(72) Inventors: S. Christopher Gladwin, Chicago, IL (US); Alan E. Holmes, Carol Stream, IL (US); Wesley Leggette, Chicago, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/290,389

(22) Filed: May 29, 2014

(65) Prior Publication Data

US 2014/0282764 A1    Sep. 18, 2014

Related U.S. Application Data

(63) Continuation of application No. 13/919,746, filed on Jun. 17, 2013, now Pat. No. 9,215,476, which is a
(Continued)

(51) Int. Cl.
*H04N 7/173* (2011.01)
*H04N 21/218* (2011.01)
(Continued)

(52) U.S. Cl.
CPC ..... *H04N 21/2181* (2013.01); *G06F 11/1076* (2013.01); *G06F 11/1092* (2013.01);
(Continued)

(58) Field of Classification Search
CPC ............ H04N 21/8456; H04N 21/231; H04N 21/23113; H04N 21/2347
(Continued)

(56) References Cited

U.S. PATENT DOCUMENTS 4,092,732 A    5/1978  Ouchi
5,454,101 A    9/1995  Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Jivka Rabovianski
(74) *Attorney, Agent, or Firm* — Garlick & Markison; Timothy W. Markison

(57) ABSTRACT

A method begins by a processing module receiving a plurality of playback requests for a stored program, wherein the stored program is stored in a dispersed storage network (DSN) memory as sets of encoded data slices. In response to the playback requests, the method continues with the processing module entering a loop that begins with retrieving a group of sets of encoded data slices, generating copies therefrom, and storing the copies. The loop continues with the processing module sending a representation of the copies to a requesting device. The method continues with the processing module exiting the loop when the last group of the request has been retrieved and repeating the loop when it has not.

35 Claims, 13 Drawing Sheets

Related U.S. Application Data continuation of application No. 12/842,842, filed on Jul. 23, 2010, now abandoned.

(60) Provisional application No. 61/256,193, filed on Oct. 29, 2009.

(51) Int. Cl.

| | | |
|---|---|---|
| *H03M 13/35* | (2006.01) | |
| *H04N 21/274* | (2011.01) | |
| *G11C 29/52* | (2006.01) | |
| *H04N 21/2343* | (2011.01) | |
| *H04N 21/239* | (2011.01) | |
| *H04N 21/2747* | (2011.01) | |
| *H04N 21/6587* | (2011.01) | |
| *G06F 11/10* | (2006.01) | |
| *H03M 13/09* | (2006.01) | |
| *H03M 13/15* | (2006.01) | |
| *H03M 13/23* | (2006.01) | |

(52) U.S. Cl.
CPC ........... *G11C 29/52* (2013.01); *H03M 13/356* (2013.01); *H04N 21/2393* (2013.01); *H04N 21/23439* (2013.01); *H04N 21/274* (2013.01); *H04N 21/2747* (2013.01); *H04N 21/6587* (2013.01); *G06F 11/1008* (2013.01); *H03M 13/09* (2013.01); *H03M 13/15* (2013.01); *H03M 13/1515* (2013.01); *H03M 13/23* (2013.01)

(58) Field of Classification Search
USPC .................... 725/25, 89, 90, 92, 93, 97, 109
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0143672 A1* | 7/2004 | Padmanabham | H04L 29/06027 709/231 |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0123056 A1* | 6/2005 | Wang | H04N 19/573 375/240.25 |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2010/0058405 A1* | 3/2010 | Ramakrishnan et al. | 725/97 |
| 2013/0028320 A1* | 1/2013 | Gardner | H04N 21/2381 375/240.12 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

(56) References Cited

OTHER PUBLICATIONS

Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner computing system 10

MEDIA DISTRIBUTION TO A PLURALITY OF DEVICES UTILIZING BUFFERED DISPERSED STORAGE

CROSS REFERENCE TO RELATED PATENTS

This application is a continuation of U.S. patent application Ser. No. 13/919,746, filed Jun. 17, 2013 and entitled, "MEDIA DISTRIBUTION TO A PLURALITY OF DEVICES UTILIZING BUFFERED DISPERSED STORAGE," which is a continuation of U.S. patent application Ser. No. 12/842,842 filed Jul. 23, 2010 and entitled "MEDIA DISTRIBUTION TO A PLURALITY OF DEVICES UTILIZING BUFFERED DISPERSED STORAGE," which claims priority pursuant to 35 U.S.C. §119(e) to U.S. Provisional Application Ser. No. 61/256,193, filed Oct. 29, 2009 and entitled "MEDIA DISTRIBUTION UTILIZING DISTRIBUTED STORAGE," all of which are hereby incorporated herein by reference in their entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

Technical Field of the Invention

This invention relates generally to computing systems and more particularly to data storage solutions within such computing systems.

Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming, etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failure issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

DETAILED DESCRIPTION OF THE INVENTION

Figure 1:
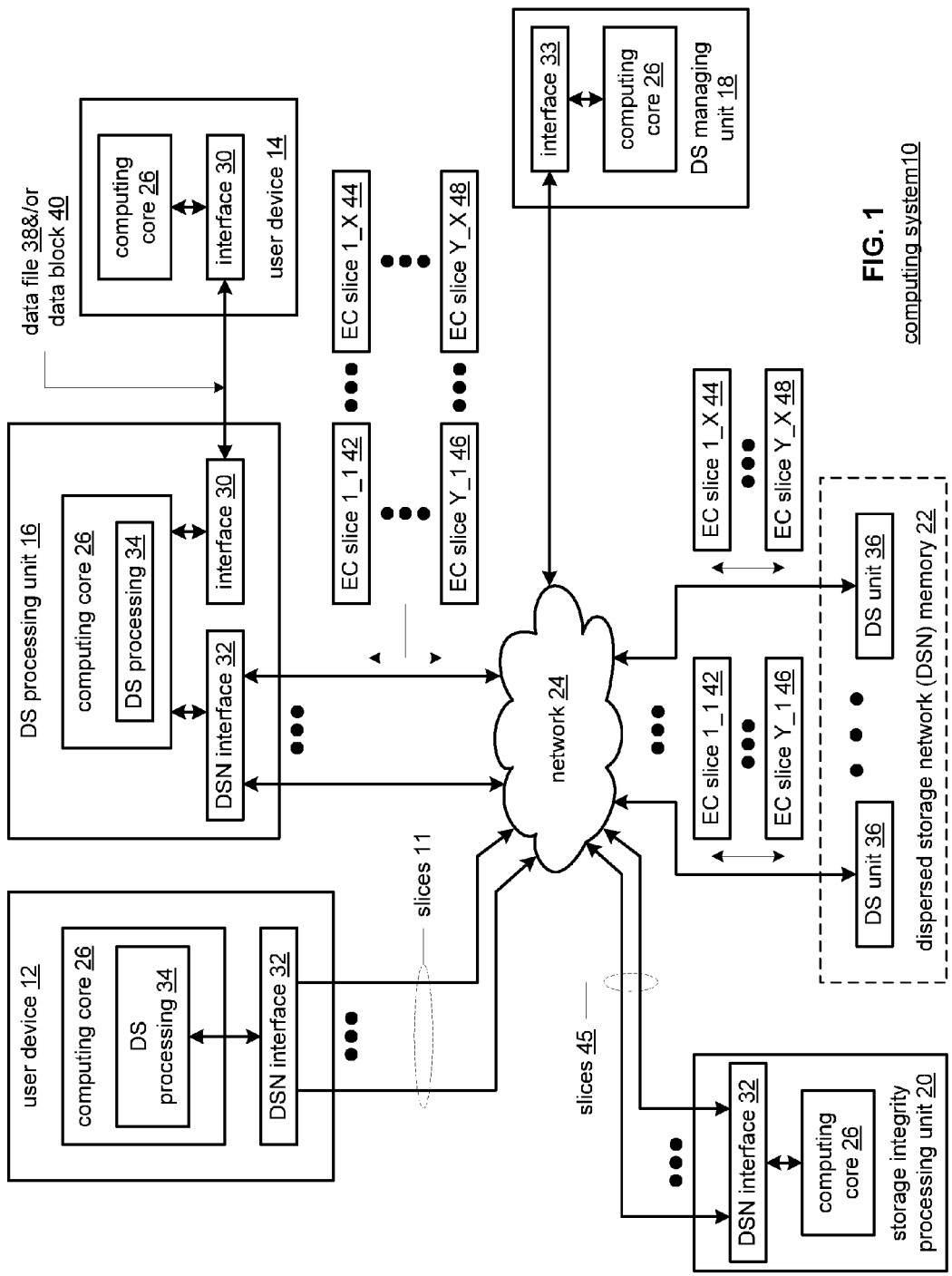
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-14.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interface 30 supports a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing unit 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or units' activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security. Further examples of encoding the data segments will be provided with reference to one or more of FIGS. 2-14.

Each DS unit 36 that receives an EC slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuilt slice, or slices, in the appropriate DS unit(s) 36 in a manner that mimics the write process previously described.

Figure 2:
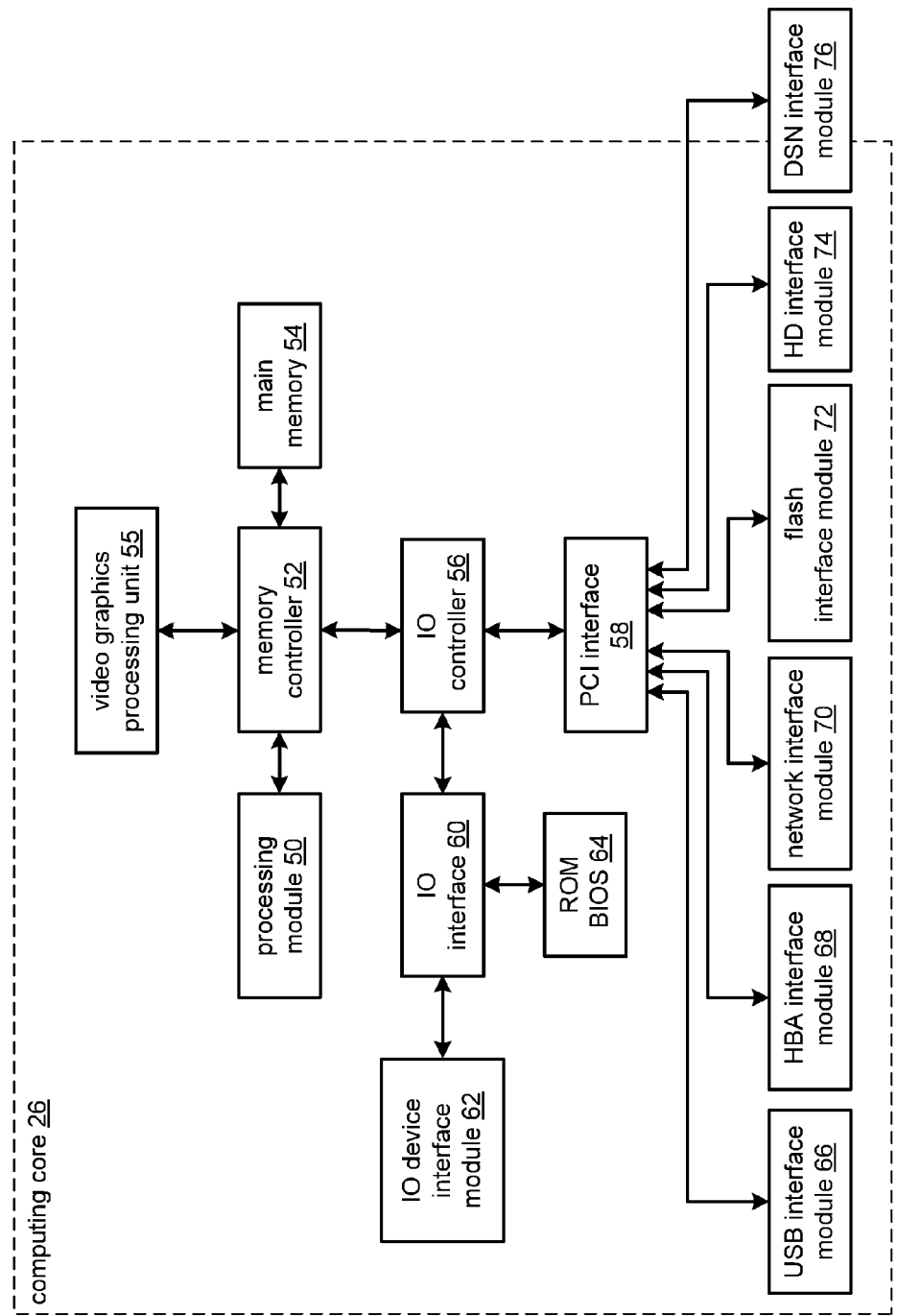
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-14.

Figure 3:
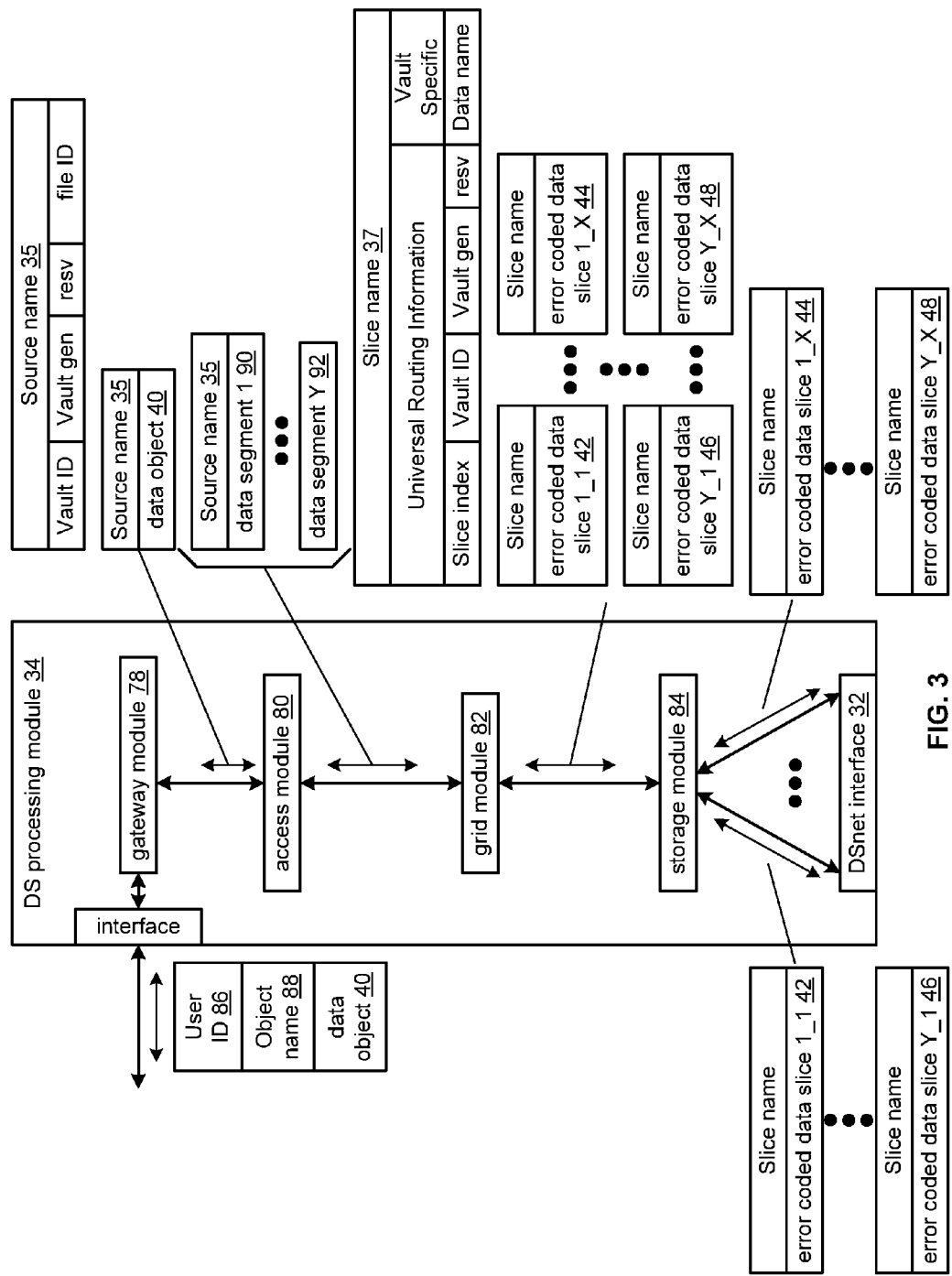
FIG. 3 is a schematic block diagram of an embodiment of a distributed storage processing unit in accordance with the invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user device 12 or of the DS processing unit 16. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the DS managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment size is fixed, then the number of segments Y varies based on the size of data object. For instance, if the data object is an image file of 4,194,304 bytes and the fixed size of each segment is 4,096 bytes, then the number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X-T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 16, which authenticates the request. When the request is authentic, the DS processing unit 16 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figure 4:
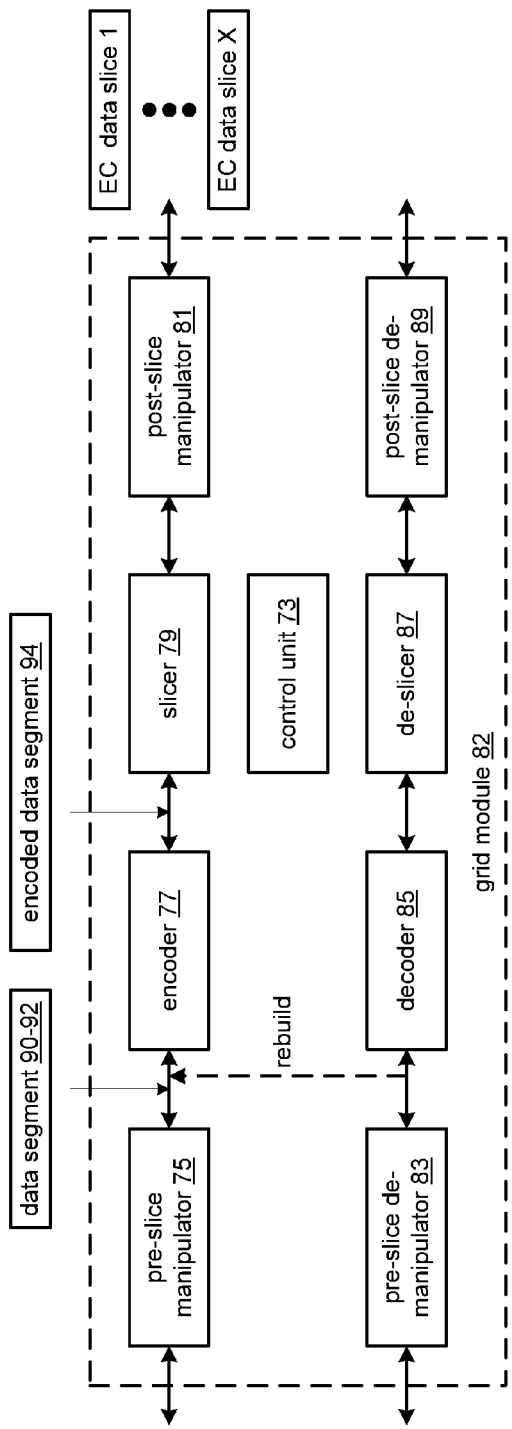
FIG. 4 is a schematic block diagram of an embodiment of a grid module in accordance with the invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of a write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X-T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

Figure 5:
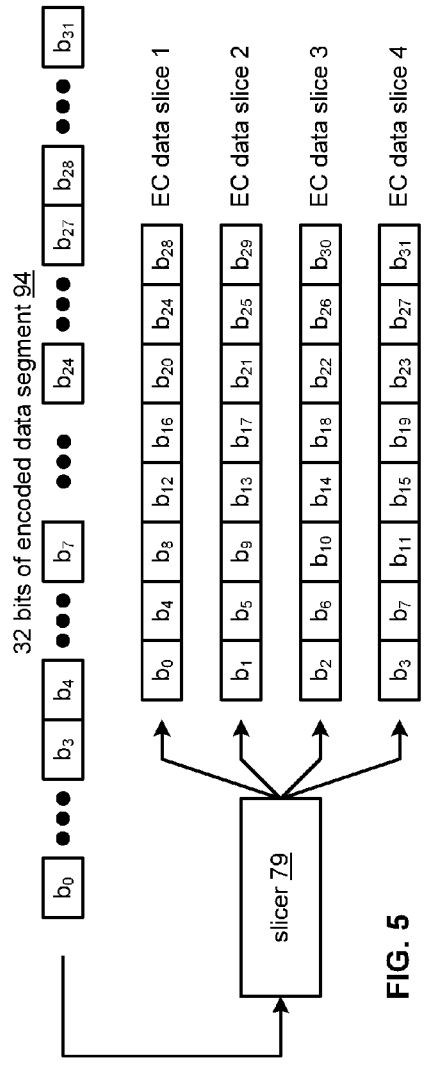
FIG. 5 is a diagram of an example embodiment of error coded data slice creation in accordance with the invention.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
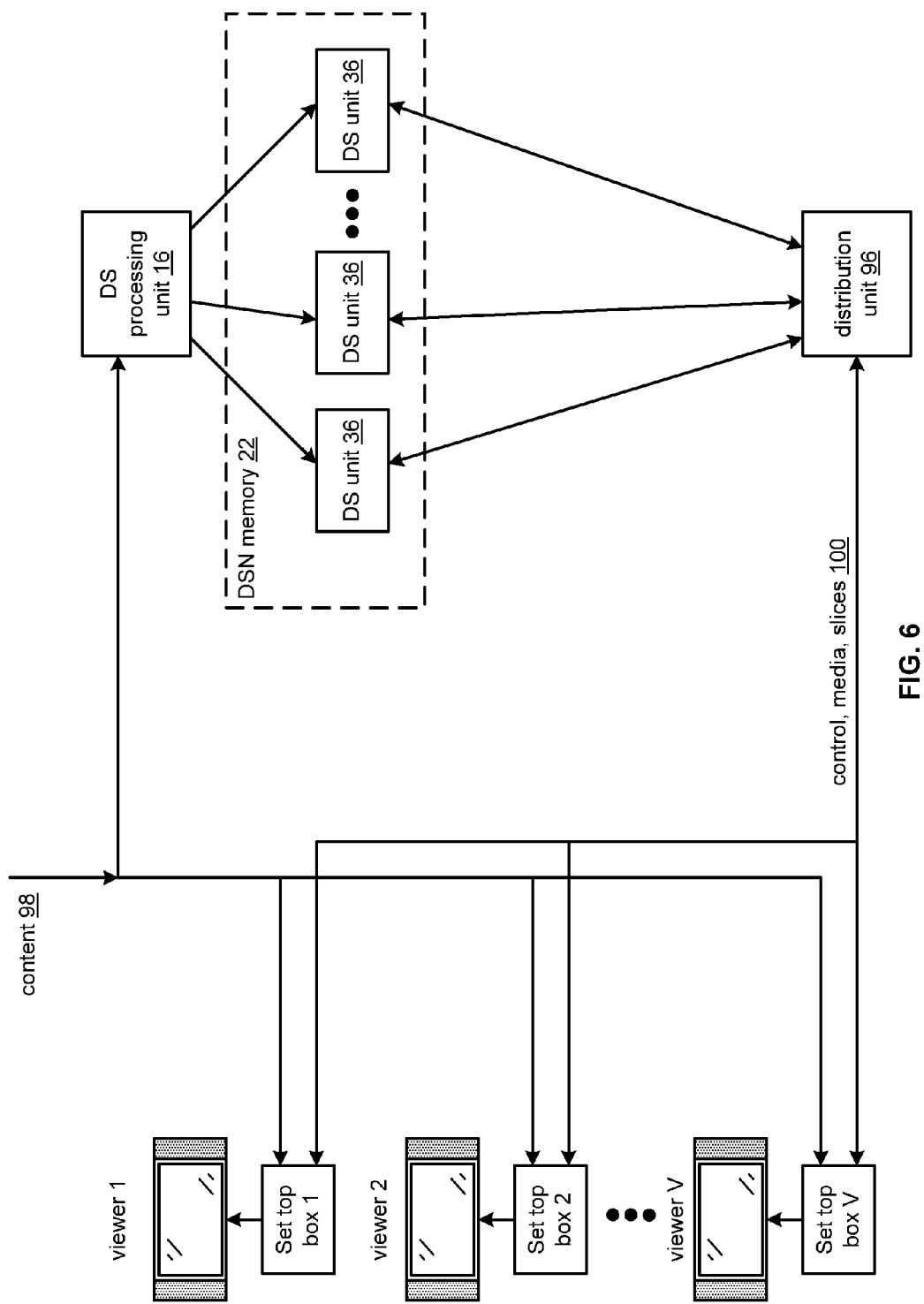
FIG. 6 is a schematic block diagram of an embodiment of a media distribution system in accordance with the invention.

FIG. 6 is a schematic block diagram of an embodiment of a media distribution system. As illustrated, the system includes a plurality of viewers 1-V, a plurality of set top boxes 1-V, the DS processing unit 16, the DSN memory 22, and a distribution unit 96.

The distribution unit 96 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). The distribution unit 96 includes a computing core 26, one or more interfaces 30, 32, and/or 33, and may include a DS processing 34. As illustrated, a viewer includes a flat panel television having a display and speakers to reproduce the media 100 that is coupled to a set top box.

The set top box (e.g., cable, satellite, land-line, twisted pair, fiber optics, Internet, etc.) includes the computing core 26 and may include the DS processing 34 to receive media slices from the playback DSN memory 194, de-slice, and decode to produce the media 100 for viewing. In addition, the set top boxes 1-V may directly select content 98 (e.g., broadcast/multicast or on-demand video over cable, satellite and/or the internet) and/or may select stored content 98 from the DSN memory 22 via the distribution unit 96. The functions of the set top box and viewer may be integrated together. For example, the viewer (e.g., including set top box functionality) may connect either directly to the DSN memory 22 to retrieve media slices 100 or through the distribution unit 96 to receive media 100. The DS processing unit 16 receives content 98 and stores error coded data slices in the DSN memory 22 as described in more detail below.

The set top box sends control commands to the distribution unit 96 and/or DS processing unit 16. The commands may include one or more of record, playback, pause, skip forward, skip backwards, and delete. For example, the set top box sends a record command to the DS processing unit 16. In response, DS processing unit 16 captures a program (e.g., all or a portion of the content 98) and stores the program as error coded data slices in the DSN memory 22 and information that uniquely identifies the particular set top box. In another example, the set top box sends a playback command to the distribution unit 96. In response, the distribution unit 96 retrieves error coded data slices from the DSN memory 22 in accordance with the information that uniquely identifies the particular set top box and sends the slices to the set top box.

The DS processing unit 16 determines which portion of the content 98 to store in the DSN memory 22. Such a determination may be based on one or more of a command, a command from the set top box, a command from the distribution unit 96, and/or a predetermination. For example, set top box 2 may send a record command to the distribution unit 96 where the record command includes a command to record the 5:30 pm evening news program via cable channel 188 on October 18. The distribution unit 96 processes the record command by sending a store command to the DS processing unit 16. The DS processing unit 16 queues the store command and executes the store command on October 18 at 5:30 pm. The DS processing unit 16 executes the store command by selecting the content 98 from cable channel 188 and receiving the content 98. Next, the DS processing unit 16 determines record operational parameters (e.g., pillar width n, write threshold, encoding method, slicing method, encryption method, etc.) and may further determine unique information associated with the requesting set top box (e.g., identification information, unique retrieval sequence information, addressing information, etc.). The DS processing unit 16 determines the record operational parameters based on one or more of a command, a command from the distribution unit 96, an estimated number of store commands received for the same content indicator, a system performance indicator, a memory utilization indicator, a policy indicator, a total population of set top boxes indicator, and a predetermination. Next, the DS processing unit 16 determines which DS units 36 to store the EC data slices and sends the EC data slices 100 with a store command to the selected DS units 36 of the DSN memory 22 for storage therein.

The DS processing unit 16 encodes the program in accordance with the record operational parameters to produce error coded data slices. The DS processing unit 16 initiates storage of the error coded data slices in the DS unit 36 and the unique information associated with the requesting set top box.

For subsequent requests to record the same program from other set top boxes, the DS processing unit 16 executes a record function. For example, the DS processing unit 16 may only store EC data slices produced from content 98 in response to receiving at least one record command from at least one set top box. In another example, the distribution unit 96 sends a record command to the DS processing unit 16 based on receiving a first record command for the content 98 and sends nothing to the DS processing unit 16 when the distribution unit 96 receives a second record command for the same content 98. In other words, the first record command for a given content portion invokes storing the content 98 as slices 100 to the DSN memory 22 and any other subsequent record commands for the same content 98 do not change the storing of that content 98 as slices 100 in the DSN memory 22.

In yet another example, the distribution unit 96 sends the store command to the DS processing unit 16 based on receiving a first or more record commands for the content portion where subsequent record requests may alter the record operational parameters. In other words, the first record command for a given content portion invokes storing the content 98 as EC data slices to the DSN memory 22 and any other subsequent record commands for the same content 98 may change the record operational parameters of that content 98. In an instance, the DS processing unit 16 may start with a 32/26 system and store slices to pillars 1-27 for the first viewer. The DS processing unit 16 may continue to store slices but to pillars 2-28 when the second viewer requests to record the same content portion. The DS processing unit 16 may change a slicing pillar width/read threshold from a 32/26 system to a 40/26 system yet storing to at least 32 pillars of the 40 to realize storing 32 of 40 pillars in some 76 million combinations and still have over 900 thousand combinations to read 26 pillars from the 32 stored pillars when even more viewers request to record the same content portion. The distribution unit 96 and/or DS processing unit 16 may change the record operational parameters prior to or during content capture.

As another example, the distribution unit 96 and/or DS processing unit 16 determines read operational parameters (e.g., pillar width n, which particular pillars are allowed to read, read threshold, decoding method, de-slicing method, decryption method, etc.) in response to receiving a record and/or playback request. Such a determination may be based on one or more of a request, a command, the number of store requests received for the same content 98, an estimated number of store requests received for the same content indicator, which combinations of pillars have already been assigned (e.g., the read operational parameters of other viewers), a system performance indicator, a memory utilization indicator, a pillar availability indicator, a policy indicator, a total population of set top boxes indicator, and/or a predetermination. For example, the DS processing unit 16 assigns set top box 1 read operational parameters to read from pillars 1-10 while assigning set top box 2 read operational parameters to read from pillars 3-12 when the system has 16 pillars and a read threshold of 10 and both set top boxes have requested the same content program. In addition, the DS processing unit 16 may assign each set top box more than one combination of allowed read pillars to improve the read reliability. The read operational parameters may be utilized in the DS processing 34 (e.g., in the distribution unit 96 and/or the set top box/viewer) to subsequently decode retrieved EC data slices 100 from the allowed read pillars to produce a desired program of the content 98. The method of operation of the DS processing unit and distribution unit 96 is discussed in greater detail with reference to FIG. 7.

Note that the number of read pillar combinations can be expressed as:

Read combinations=$n!/k!(n-k)!$ where $n$=pillar width, $k$=read threshold

Further note that the minimum number of unique read combinations is greater than or equal to the estimated number of viewers that record the same content portion. For example, at most 8,008 unique viewers (each with one read pillar combination) can be supported when the pillar width is 16 and the read threshold is 10. In another example, at most 90,619 unique viewers (each with ten read pillar combinations to choose from) can be supported when the pillar width is 32 and the read threshold is 26. In other words, there are 906,192 unique ways to choose 26 pillars from 32 and the viewer may be assigned 10 of those ways to only read 26 of the 32 pillars. Adding more combinations per user may improve the reliability of decoding slices 100 into data segments but may also lower the number of viewers that are allowed to record the same content portion.

In a playback scenario, the set top box sends a playback request to the distribution unit 96 to invoke the retrieval of stored EC data slices from the DSN memory 22. The distribution unit 96 determines if unique read operational parameters have been assigned for this set top box based on a list lookup (e.g., a media object table and/or user vault). Note that the unique read operational parameters may be established when the set top box initiated the record command or when the set to box initiated the playback command. Further note that the read operational parameters determination may be based on one or more of the record operational parameters, a command, the number of store commands received for the same program of the content 98, an estimated number of store commands received for the same content indicator, which combinations of pillars have already been assigned (e.g., the read operational parameters of other viewers), a system performance indicator, a memory utilization indicator, a pillar availability indicator, a policy indicator, a total population of set top boxes indicator, and/or a predetermination.

Next, the distribution unit 96 determines the DS units 36 based on the media object ID and/or the read operational parameters. The distribution unit 96 may utilize a first combination of read operational parameters to attempt to retrieve and decode the EC data slices from the DS units 36. The distribution unit 96 determines if the slice retrieval and decoding is successful. The distribution unit 96 may utilize a second combination of read operational parameters to attempt to retrieve and decode the slices 100 when the distribution unit 96 determines that the attempt utilizing the first combination of read operational parameters was not successful. The distribution unit 96 continues this process until all the assigned combinations of read operational parameters have been tried. Note that the distribution unit 96 may utilize read operational parameters that vary from data segment to data segment. For example, the distribution unit 96 may utilize retrieved EC data slices from pillars 1, 3, 4, 5, 6, 7, 8, 9, 10, 11, 12 to produce a first data segment and may utilize retrieved EC data slices from pillars 1, 4, 5, 6, 7, 8, 9, 10, 11, 12, 13 to produce a second data segment.

The distribution unit 96 may assign at least one additional combination of read operational parameters when the distribution unit 96 determines that all of the previously assigned combinations of read operational parameters have been tried without success (e.g., failure of decoding the data segment from available slices 100). Note that the at least one additional combination of read operational parameters is unique with respect to all of the other combinations of read operational parameters assigned to other viewers/set top boxes for one or more data segments. For example, the set top box may be assigned four combinations of read pillars to utilize to retrieve and decode EC data slices. The distribution unit 96 attempts to utilize the first combination and will determine if that is successful. The distribution unit 96 continues to try each of the four combinations until it finds a combination that is successful. The distribution unit 96 determines an additional combination if the previously assigned combination(s) all fail. The distribution unit 96 retrieves, de-slices, and decodes the EC data slices to produce the program when a successful combination of read operational parameters is utilized. The distribution unit 96 sends the EC data slices and/or the decoded program to a set top box requesting playback. The method of operation of the set top box, DS processing unit 16, and distribution unit 96 is discussed in greater detail with reference to FIG. 7.

Figure 7:
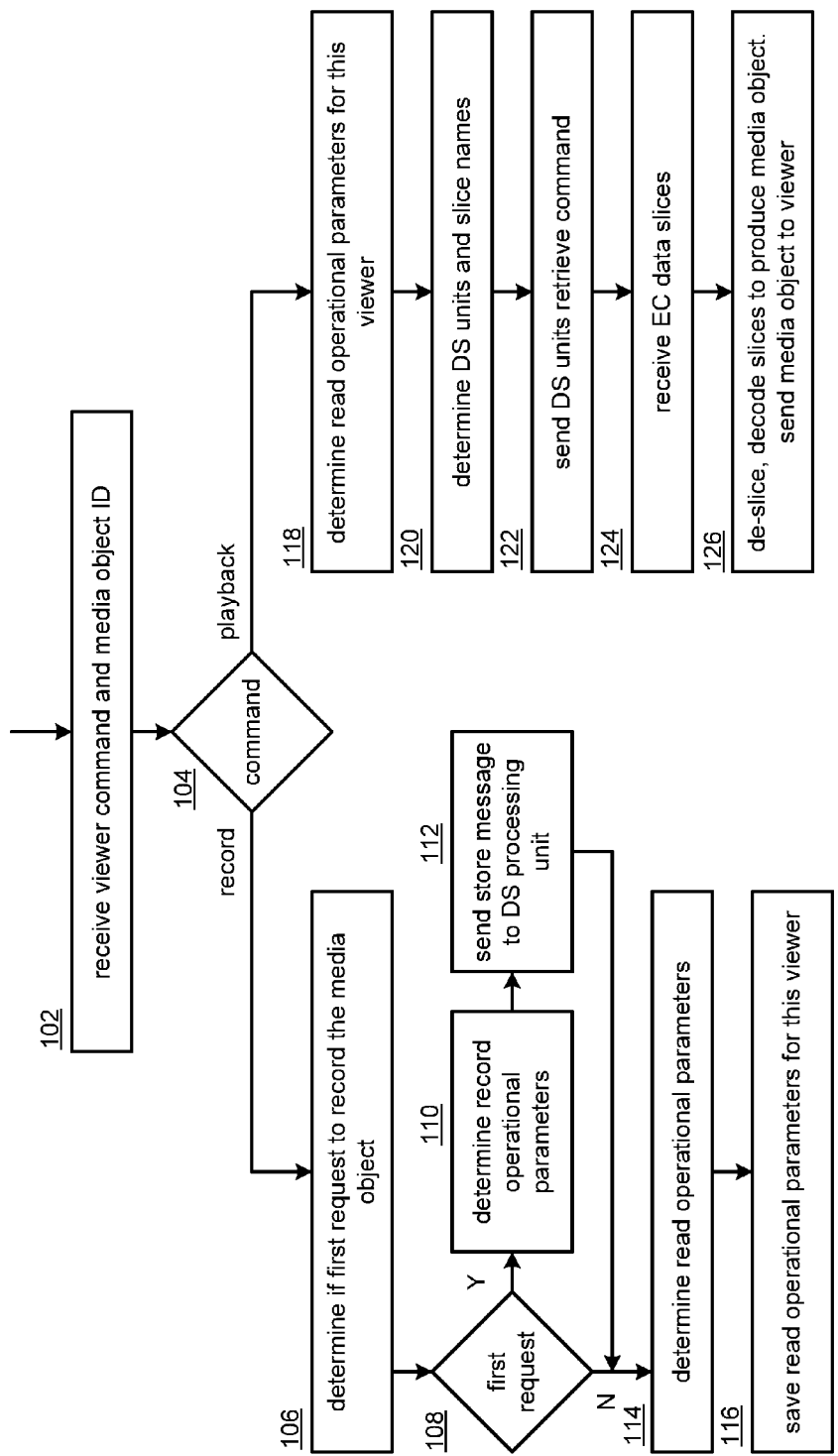
FIG. 7 is a flowchart illustrating an example of recording and playback of media in accordance with the invention.

FIG. 7 is a flowchart illustrating an example of recording and playback of media. The method begins at step 102 where a processing module (e.g., of the distribution unit 96) receives a viewer command (e.g., a set top box request), a viewer ID, and media object identifier (ID). The media object ID is an identifier for the program portion of the content 98. For example, media object ID 3017301881018 may correspond to the 30 minute 5:30 pm evening news on cable channel 188 on October 18. At step 104 the processing module determines if the command is a record request or a playback request by examining the received command.

At step 106 the processing module determines if this is the first request to record the media object when the processing module determines that the command is the record command. Such a determination may be based on one or more of reading a vault media object table, reading a local media object table, and requesting information in a media object table from the DS processing unit/distribution unit. The media object table may list the identity of the set top boxes that have requested to record the same media object ID. At step 108, the processing module determines that this is the first request to record the media object when the media object table indicates no other viewers have requested to record the same media object ID. Note that the processing module may receive a plurality of requests to record a broadcast of data. The method branches to step 114 to determine the read operational parameters when the processing module determines that this is not the first request to record the media object.

At step 110 the processing module determines the record operational parameters when the processing module determines that this is the first request to record the media object (e.g., pillar width n, write threshold, encoding method, slicing method, encryption method, encryption key, etc.). Such a determination of the record operational parameters may be based on one or more of a command, a command from the distribution unit/DS processing unit, an estimated number of store commands received for the same content indicator, a system performance indicator, a memory utilization indicator, a policy indicator, a total population of set top boxes indicator, and a predetermination. The processing module updates the media object table to include a requesting device ID and record operational parameters associated with the media object ID.

At step 112 the processing module sends the DS processing unit a store command message where the message includes the store command, the media object ID, and the record operational parameters. Additionally, the processing module encodes the data using an error coding dispersal storage function an in accordance with the record operational parameters to produce a plurality of sets of encoded data slices (e.g., EC data slice sets for each data segment) when the data is broadcast and in response to a request of the plurality of requests.

At step 114 the processing module generates read operational parameters for this media object in the form of a unique retrieval matrix for each of the plurality of requests based on an identity of a requesting device and the error coding dispersal storage function to produce a plurality of unique retrieval matrixes. Alternatively, the processing module determines the read operational parameters in response to receiving a playback command as discussed below with reference to step 118. The processing module generates the unique retrieval matrix based on at least one of a data identifier, a unique retrieval matrix associated with at least one other requesting device (e.g., those already assigned), a unique retrieval matrix not associated with any other requesting device (e.g., those not already assigned), and a unique retrieval matrix functionality indicator (e.g., an operational status indicator). Note that the plurality of unique retrieval matrixes includes a plurality of collectives of pillar identifiers, wherein each collective includes pillar identifiers corresponding to at least one of the plurality of sets of encoded data slices for retrieving corresponding encoded data slices. The collective identifies a set of pillar identifiers for one or more data segments. Further note that an individual unique retrieval matrix includes one or more of a pillars list, a segmenting protocol, a pre-slice data manipulation function, a forward error correction encoding function, a slicing pillar width, a post-slice data manipulation function, a write threshold, and a read threshold. Note that the pillars list includes one of at least one collective of pillar identifiers associated with less than a slicing pillar width number and at least the read threshold number of a plurality of dispersed storage (DS) units associated with the DSN memory, and at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices. In other words, no other requesting device is assigned the same plurality of collectives of pillar identifiers for this data. At step 116, the processing module stores the plurality of sets of encoded data slices and the plurality of unique retrieval matrixes in a dispersed storage network (DSN) memory as a plurality of unique copies of the data.

The processing module receives a plurality of playback requests for data from a plurality of requesting devices, wherein the data is encoded via an error coding dispersal storage function to produce a plurality of sets of encoded data slices which are stored in a dispersed storage network (DSN) memory. At step 118 the processing module determines the read operational parameters for each of the plurality of playback requests. The processing module determines the read operational parameters by statically or dynamically obtaining a plurality of unique retrieval matrixes based on identities of the plurality of requesting devices. In an example of the static method, the processing module retrieves the plurality of unique retrieval matrixes from the DSN memory based on the identities of the plurality of requesting devices (e.g., a lookup of the assignment from a previous playback request or a record request).

In an example of the dynamic method, the processing module generates a unique retrieval matrix for each of the plurality of playback requests based on one or more of the identities of the plurality of requesting devices, the error coding dispersal storage function, a data identifier, a unique retrieval matrix associated with at least one other requesting device, and a unique retrieval matrix functionality indicator. Note that the unique retrieval matrix includes one or more of a pillars list, a segmenting protocol, a pre-slice data manipulation function, a forward error correction encoding function, a slicing pillar width, a post-slice data manipulation function, a write threshold, and a read threshold. Further note that the pillars list includes one of at least one collective of pillar identifiers associated with less than a slicing pillar width number and at least the read threshold number of a plurality of dispersed storage (DS) units associated with the DSN memory or at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices.

At step 120 the processing module determines the present (e.g., a sequential data segment) plurality of error coded slice names corresponding to the slices of the data by transforming the data ID (e.g., object name) into the slice names. In addition at step 120 the processing module determines DS units based on one or more of the unique retrieval matrix pillars list, the data ID, a translation of the data ID to a virtual DSN address, and a lookup of the virtual DSN address to physical location table. For example, the processing module determines to retrieve from DS units 3, 4, 5, 6, 7, 11, 12, 13, 15, 16 when the unique retrieval matrix pillars list for a present collective of error coded data slices includes the pillars corresponding to DS units 3, 4, 5, 6, 7, 11, 12, 13, 15, 16 even when the virtual DSN address to physical location table includes DS units 1-16 for the data.

At step 122 the processing module sends the DS units retrieve slice commands and at step 124 receives the EC data slices to retrieve, from the DSN memory, a plurality of unique copies of the plurality of sets of encoded data slices in accordance with the plurality of unique retrieval matrixes. For example, the processing module retrieves one set of error coded data slices, corresponding to a data segment, at a time and retrieves the slices from DS units associated with the pillars of the pillars list from the unique retrieval matrix associated with the data segment. Additionally, the processing module may output a unique copy of the plurality of unique copies of the plurality of sets of encoded data slices to a corresponding requesting device. Additionally, at step 126, the processing module may decode a unique copy of the plurality of unique copies of the plurality of sets of encoded data slices in accordance with the error coding dispersal storage function to produce a unique copy of the data. Next, the processing module outputs the unique copy of the data to a corresponding requesting device.

Note that the set top box/viewer includes DS processing to convert the EC data slices into the media object for the viewer. Alternatively, the set top box/viewer may process media object data received from the processing module of the distribution unit including video or audio or video and audio in a real time stream. The set top box/viewer may send flow control commands (e.g., pause, stop, rewind, fast forward, skip backwards, skip forwards, etc.) to the distribution unit such that the distribution unit varies the real time stream in response to the commands.

In another example of a record and playback scenario, a method begins where a processing module receives a plurality of record requests to record a broadcast of data. The processing module encodes the data using an error coding dispersal storage function to produce a plurality of sets of encoded data slices when the data is broadcast and in response to a record request of the plurality of record requests. The processing module generates a list of requesting device identities corresponding to the plurality of requests. Next, the processing module stores the plurality of sets of encoded data slices and the list of requesting device identities in a dispersed storage network (DSN) memory. As a specific example, the processing module encodes the list using the error coding dispersal storage function to produce list data slices and stores the slices in the DSN memory.

Alternatively, or in addition to storing the slices in the DSN memory, the processing module stores the list data slices in a local memory The example continues where the processing module receives a playback request from a device identified in the list of requesting device identities (e.g., the processing module receives a request and verifies that the device ID is in the list). The processing module generates a unique retrieval matrix for the device based in part on the error coding dispersed storage function. Note that the unique retrieval matrix includes a collective of pillar identifiers, wherein the collective includes pillar identifiers corresponding to at least one of the plurality of sets of encoded data slices for retrieving corresponding encoded data slices. Note that the collective may identify pillars corresponding to one or more data segments). Further note that the unique retrieval matrix includes one or more of a pillars list, a segmenting protocol, a pre-slice data manipulation function, a forward error correction encoding function, a slicing pillar width, a post-slice data manipulation function, a write threshold, and a read threshold. Note that the pillars list includes at least one collective of pillar identifiers associated with less than a slicing pillar width number and at least the read threshold number of a plurality of dispersed storage (DS) units associated with the DSN memory or at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices. For instance, no other requesting device is assigned the same combination of pillars for each data segment. Additionally, the processing module may generate the unique retrieval matrix based on at least one of a data identifier, a unique retrieval matrix associated with at least one other requesting device identified in the list of requesting device identities (e.g., already assigned), a unique retrieval matrix not associated with any other requesting device identified in the list of requesting device identities (e.g., potentially available for assignment), and a unique retrieval matrix functionality indicator (e.g., an operational readiness indicator of associated DS unit status).

The example continues where the processing module outputs a unique plurality of sets of encoded data slices from the plurality of sets of encoded data slices in accordance with the unique retrieval matrix. For instance, the processing module retrieves the unique plurality of sets of encoded data slices from the DSN memory in accordance with the unique retrieval matrix (e.g., from the unique plurality of pillar collectives) and sends the slices to the requesting device. Additionally, the processing module may decode the unique plurality of sets of encoded data slices in accordance with the error coding dispersal storage function to produce a unique copy of the data, and output the unique copy of the data to the device. Additionally, the processing module may receive a second playback request from the device and generate a second unique retrieval matrix for the device based on the error coding dispersed storage function.

Next, the processing module outputs a second unique plurality of sets of encoded data slices from the plurality of sets of encoded data slices in accordance with the second unique retrieval matrix. For instance, the requesting device is assigned a different unique retrieval matrix for each playback of the data. Additionally, the processing module may store the unique retrieval matrix for the device in the DSN memory and receive a subsequent playback request from the device.

Next, the processing module retrieves the unique retrieval matrix for the device from the DSN memory and outputs the unique plurality of sets of encoded data slices from the plurality of sets of encoded data slices in accordance with the unique retrieval matrix. For instance, the processing module utilizes the same unique retrieval matrix for the device for each playback of the data. Additionally, the processing module may output the unique retrieval matrix for the device to the device and receive a subsequent playback request from the device, wherein the request includes the unique retrieval matrix for the device. Next, the processing module outputs the unique plurality of sets of encoded data slices from the plurality of sets of encoded data slices in accordance with the unique retrieval matrix.

Figure 8:
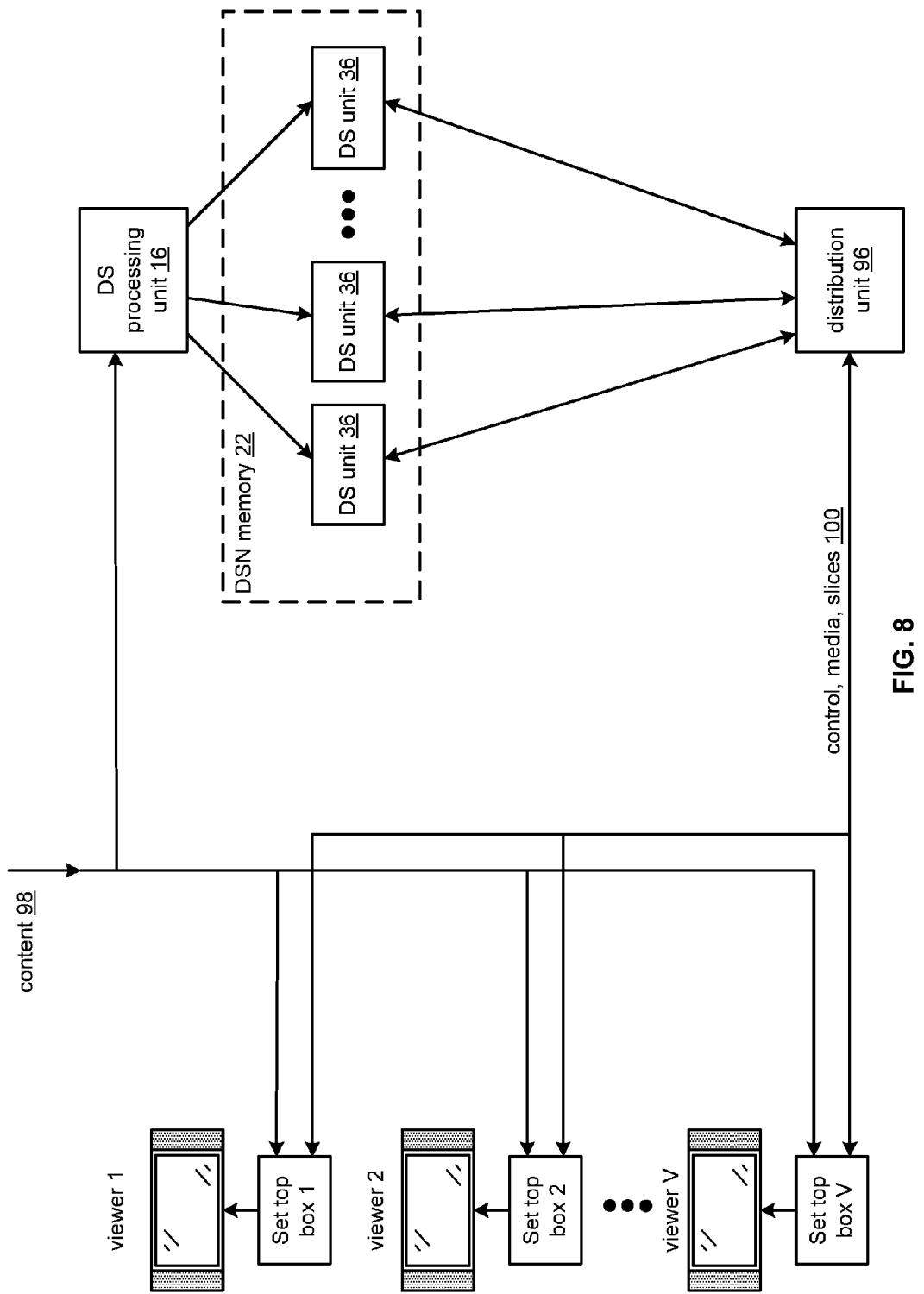
FIG. 8 is a schematic block diagram of another embodiment of a media distribution system in accordance with the invention.

FIG. 8 is a schematic block diagram of another embodiment of a media distribution system. As illustrated, the system includes a plurality of viewers 1-V, a plurality of set top boxes 1-V, the DS processing unit 16, the DSN memory 22, and a distribution unit 96. The plurality of viewers 1-V, the plurality of set top boxes 1-V, the DS processing unit 16, the DSN memory 22, and the distribution unit 96 operate in accordance with, but not limited to, the operations as described previously with reference to FIG. 6.

In an example of operation, a processing module (e.g., of the distribution unit) receives a plurality of requests to retrieve a stored program that is stored as a plurality of sets of encoded data slices in accordance with record error coding dispersal storage function parameters in a dispersed storage network (DSN) memory. The processing module receives a first one of the plurality of requests and determines first playback error coding dispersal storage function parameters based on the request and the record error coding dispersal storage function parameters. The processing module retrieves a first set of the plurality of sets of encoded data slices based on the first playback error coding dispersal storage function parameters.

Next, the processing module outputs the first set of the plurality of sets of encoded data slices to a first requesting device associated with the first one of the plurality of requests. The processing module decodes the first set of the plurality of sets of encoded data slices based on the first playback error coding dispersal storage function parameters to produce first recovered data. In addition, the processing module may send the first recovered data to the first requesting device. Next, the processing module modifies the record error coding dispersal storage function parameters based on the first request and the record error coding dispersal storage function parameters to produce modified record error coding dispersal storage function parameters. For instance, the processing module changes the record error coding dispersal storage function parameters after each retrieval.

Next, the processing module encodes the first recovered data in accordance with the modified record error coding dispersal storage function parameters to produce a first modified set of the plurality of sets of encoded data slices. The processing module stores the first modified set of the plurality of sets of encoded data slices in the DSN memory. The processing module receives a second one of the plurality of requests and determines second playback error coding dispersal storage function parameters based on the request and the modified record error coding dispersal storage function parameters. The processing module retrieves the first modified set of the plurality of sets of encoded data slices based on the second playback error coding dispersal storage function parameters from the DSN memory.

Next, the processing module outputs the first set of the plurality of sets of encoded data slices to a second requesting device associated with the second one of the plurality of requests. The processing module decodes the first set of the plurality of sets of encoded data slices based on the second playback error coding dispersal storage function parameters to produce the first recovered data. In addition, the processing module may send the first recovered data to the second requesting device.

Next, the processing module modifies the modified record error coding dispersal storage function parameters based on the second request and the modified record error coding dispersal storage function parameters to produce further modified record error coding dispersal storage function parameters. Note that the processing module changes the record parameters after each retrieval.

Next, the processing module encodes the first recovered data in accordance with the further modified record error coding dispersal storage function parameters to produce a first further modified set of the plurality of sets of encoded data slices. Note that the slices are different as compared to the last stored set. The processing module stores the first further modified set of the plurality of sets of encoded data slices in the DSN memory. Another method of operation is discussed in greater detail with reference to FIG. 9.

Figure 9:
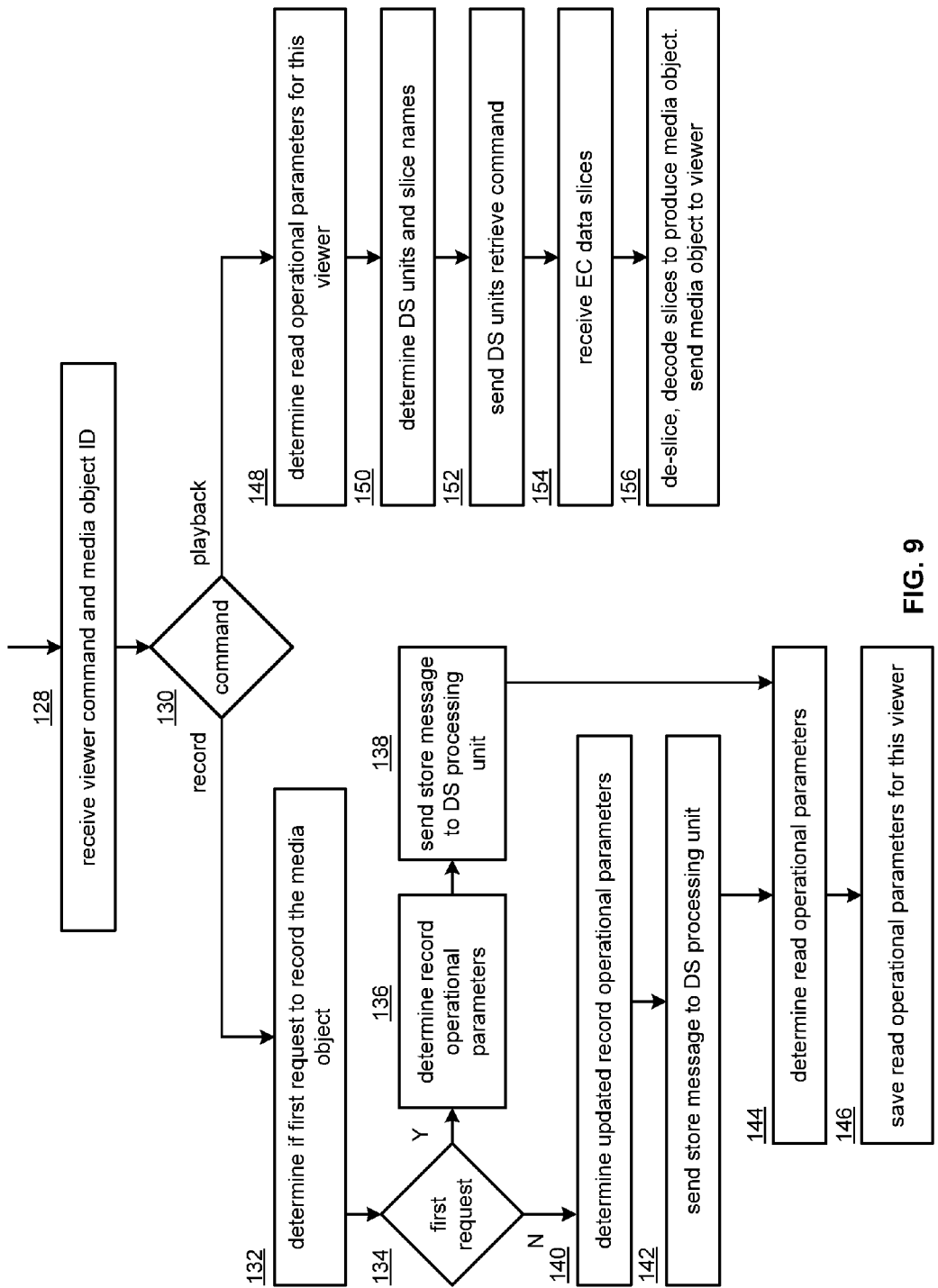
FIG. 9 is another flowchart illustrating another example of recording and playback of media in accordance with the invention.

FIG. 9 is another flowchart illustrating another example of recording and playback of media. The method begins at step 128 where a processing module (e.g., of the distribution unit 96) receives a viewer command (e.g., a set top box request), a viewer ID, and media object identifier (ID). The media object ID is an identifier for the program portion of the content 98. For example, media object ID 3017301881018 may correspond to the 30 minute 5:30 pm evening news on cable channel 188 on October 18. At step 130 the processing module determines if the command is a record request or a playback request by examining the received command.

At step 132 the processing module determines if this is the first request to record the media object when the processing module determines that the command is the record command. Such a determination may be based on one or more of reading a vault media object table, reading a local media object table, and requesting information in a media object table from the DS processing unit/distribution unit. The media object table may list the identity of the set top boxes that have requested to record the same media object ID. At step 134, the processing module determines that this is the first request to record the media object when the media object table indicates no other viewers have requested to record the same media object ID. Note that the processing module may receive a plurality of requests to record a broadcast of data. The method branches to step 140 to determine updated record operational parameters when the processing module determines that this is not the first request to record the media object.

At step 136 the processing module determines the record operational parameters when the processing module determines that this is the first request to record the media object (e.g., pillar width n, write threshold, encoding method, slicing method, encryption method, encryption key, etc.). Such a determination of the record operational parameters may be based on one or more of a command, a command from the distribution unit/DS processing unit, an estimated number of store commands received for the same content indicator, a system performance indicator, a memory utilization indicator, a policy indicator, a total population of set top boxes indicator, and a predetermination. The processing module updates the media object table to include a requesting device ID and record operational parameters associated with the media object ID.

At step 138 the processing module sends the DS processing unit a store command message where the message includes the store command, the media object ID, and the record operational parameters. Additionally, the processing module encodes the data using an error coding dispersal storage function in accordance with the record operational parameters to produce a plurality of sets of encoded data slices (e.g., EC data slice sets for each data segment) when the data is broadcast and in response to a request of the plurality of requests. The method branches to step 144 to determine read operational parameters for the requester.

At step 140 the processing module determines updated record operational parameters. Such a determination may be based on one or more of the record operational parameters, a command, a command from the distribution unit/DS processing unit, an estimated number of store commands received for the same content indicator, a system performance indicator, a memory utilization indicator, a policy indicator, a total population of set top boxes indicator, and a predetermination. For example, the processing module determines to modify the record parameters by dropping pillars 3 and 6 and adding pillars 7 and 2. The processing module updates the media object table to include a requesting device ID and record operational parameters associated with the media object ID.

At step 142 the processing module sends the DS processing unit a store command message where the message includes the store command, the media object ID, and the updated record operational parameters. Additionally, the processing module encodes the data using an error coding dispersal storage function in accordance with the updated record operational parameters to produce a plurality of sets of encoded data slices (e.g., EC data slice sets for each data segment) when the data is broadcast and in response to a request of the plurality of requests.

At step 144 the processing module generates read operational parameters for this media object in the form of a unique retrieval matrix for each of the plurality of requests based on an identity of a requesting device and the error coding dispersal storage function to produce a plurality of unique retrieval matrixes. Alternatively or in addition to, the processing module determines the read operational parameters in response to receiving a playback command as discussed below with reference to step 148. The processing module generates the unique retrieval matrix based on at least one of a data identifier, a unique retrieval matrix associated with at least one other requesting device (e.g., those already assigned), a unique retrieval matrix not associated with any other requesting device (e.g., those not already assigned), and a unique retrieval matrix functionality indicator (e.g., an operational status indicator). Note that the plurality of unique retrieval matrixes includes a plurality of collectives of pillar identifiers, wherein each collective includes pillar identifiers corresponding to at least one of the plurality of sets of encoded data slices for retrieving corresponding encoded data slices. The collective identifies a set of pillar identifiers for one or more data segments. Further note that an individual unique retrieval matrix includes one or more of a pillars list, a segmenting protocol, a pre-slice data manipulation function, a forward error correction encoding function, a slicing pillar width, a post-slice data manipulation function, a write threshold, and a read threshold. Note that the pillars list includes one of at least one collective of pillar identifiers associated with less than a slicing pillar width number and at least the read threshold number of a plurality of dispersed storage (DS) units associated with the DSN memory, and at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices. In other words, no other requesting device is assigned the same plurality of collectives of pillar identifiers for this data. At step 146 the processing module stores the plurality of sets of encoded data slices and the plurality of unique retrieval matrixes in a dispersed storage network (DSN) memory as a plurality of unique copies of the data.

The processing module receives a plurality of playback requests for data from a plurality of requesting devices, wherein the data is encoded via an error coding dispersal storage function to produce a plurality of sets of encoded data slices which are stored in a dispersed storage network (DSN) memory. At step 148 the processing module determines the read operational parameters for the plurality of playback requests when the processing module determines that the command is the playback command. The processing module determines the read operational parameters by statically or dynamically obtaining a plurality of unique retrieval matrixes based on identities of the plurality of requesting devices. In an example of the static method, the processing module retrieves the plurality of unique retrieval matrixes from the DSN memory based on the identities of the plurality of requesting devices (e.g., a lookup of the assignment from a previous playback request or a record request). In an example of the dynamic method, the processing module generates a unique retrieval matrix for each of the plurality of playback requests based on one or more of the identities of the plurality of requesting devices, the error coding dispersal storage function, a data identifier, a unique retrieval matrix associated with at least one other requesting device, and a unique retrieval matrix functionality indicator. Note that the unique retrieval matrix includes one or more of a pillars list, a segmenting protocol, a pre-slice data manipulation function, a forward error correction encoding function, a slicing pillar width, a post-slice data manipulation function, a write threshold, and a read threshold. Further note that the pillars list includes one of at least one collective of pillar identifiers associated with less than a slicing pillar width number and at least the read threshold number of a plurality of dispersed storage (DS) units associated with the DSN memory or at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices.

At step 150 the processing module determines the present (e.g., a sequential data segment) plurality of error coded slice names corresponding to the slices of the data by transforming the data ID (e.g., object name) into the slice names. In addition at step 150 the processing module determines DS units based on one or more of the unique retrieval matrix pillars list, the data ID, a translation of the data ID to a virtual DSN address, and a lookup of the virtual DSN address to physical location table. For example, the processing module determines to retrieve from DS units 3, 4, 5, 6, 7, 11, 12, 13, 15, 16 when the unique retrieval matrix pillars list for a present collective of error coded data slices includes the pillars corresponding to DS units 3, 4, 5, 6, 7, 11, 12, 13, 15, 16 even when the virtual DSN address to physical location table includes DS units 1-16 for the data.

At step 152 the processing module sends the DS units retrieve slice commands and at step 154 receives the EC data slices to retrieve, from the DSN memory, a plurality of unique copies of the plurality of sets of encoded data slices in accordance with the plurality of unique retrieval matrixes. For example, the processing module retrieves one set of error coded data slices, corresponding to a data segment, at a time, and retrieves the slices from DS units associated with the pillars of the pillars list from the unique retrieval matrix associated with the data segment. Additionally, the processing module may output a unique copy of the plurality of unique copies of the plurality of sets of encoded data slices to a corresponding requesting device. Additionally, at step 156, the processing module may decode a unique copy of the plurality of unique copies of the plurality of sets of encoded data slices in accordance with the error coding dispersal storage function to produce a unique copy of the data. Next, the processing module outputs the unique copy of the data to a corresponding requesting device.

Note that the set top box/viewer includes DS processing to convert the EC data slices into the media object for the viewer. Alternatively, the set top box/viewer may process media object data received from the processing module of the distribution unit including video or audio or video and audio in a real time stream. The set top box/viewer may send flow control commands (e.g., pause, stop, rewind, fast forward, skip backwards, skip forwards, etc.) to the distribution unit such that the distribution unit varies the real time stream in response to the commands.

Figure 10:
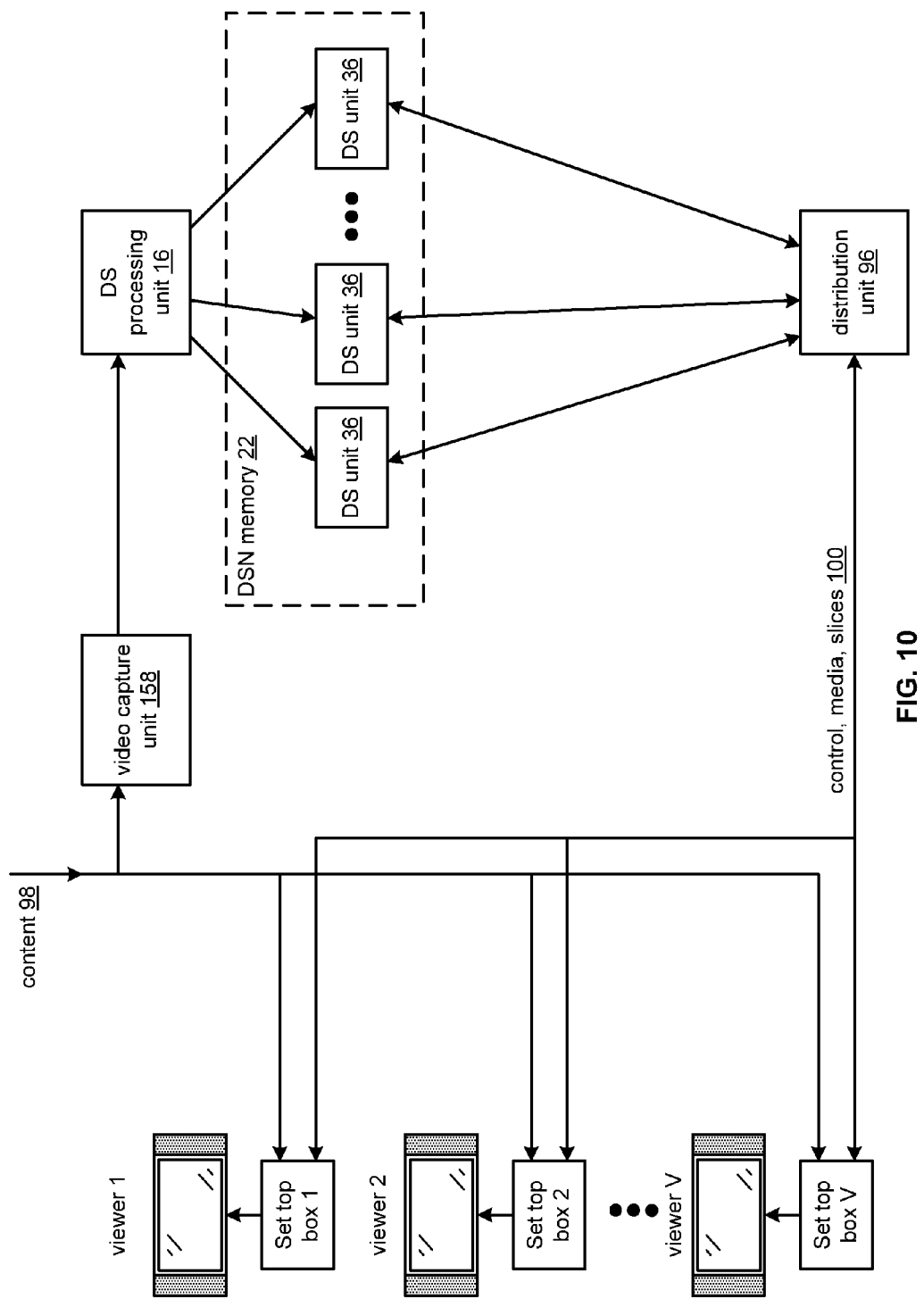
FIG. 10 is a schematic block diagram of another embodiment of a media distribution system in accordance with the invention.

FIG. 10 is a schematic block diagram of another embodiment of a media distribution system. As illustrated, the system includes a plurality of viewers 1-V, a plurality of set top boxes 1-V, a video capture unit 158, a DS processing unit 16, a DSN memory 22, and a distribution unit 96.

The distribution unit 96 and the video capture unit 158 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). The distribution unit 96 and the video capture unit 158 each includes a computing core 26, one or more interfaces 30, 32, and/or 33, and may include a DS processing 34. As illustrated, the viewer comprises a flat panel television including a display and speakers to reproduce the media 100. The viewer may reproduce the media 100 (e.g., video, audio, pictures, web content) output from the set top box.

The set top box may include the computing core 26 and may include the DS processing 34 to receive media slices from the playback DSN memory 194, de-slice, and decode to produce the media 100 for viewing. In addition, the set top box 1-V may directly select content 98 (e.g., broadcast/multicast or on-demand video over cable, satellite and/or the internet) and/or may select stored content 98 from the DSN memory 22 via the distribution unit 96. The functions of the set top box and viewer may be integrated together. For example, the viewer (e.g., including set top box functionality) may connect either directly to the DSN memory 22 to retrieve media slices 100 or through the distribution unit 96 to receive media 100. The video capture unit 158 may route portions of content 98 to the DS processing unit 16 for processing and storage to the DSN memory 22. In an implementation instance, the video capture unit 158 and DS processing unit 16 are implemented as an integrated DS processing unit 16 to receive content 98 and store slices in the DSN memory 22.

The set top box sends control commands to the video capture unit 158, the distribution unit 96 and/or DS processing unit. The commands may include one or more of but not limited to record, playback, pause, skip forward, skip backwards, and delete. For example, a set top box may send a record command to the video capture unit 158. In response, the video capture unit 158 captures a program (e.g., a portion of the content 98) and commands the DS processing unit 16 to store the program as data slices in the DSN memory 22. In another example, the set top box sends a playback command to the distribution unit 96. In response, the distribution unit 96 retrieves error coded data slices from the DSN memory 22 and sends the slices to the set top box.

The video capture unit 158 determines which portion of the content 98 to store in the DSN memory 22 for subsequent retrieval and consumption by one or more of the set top boxes based on the received commands. Such a determination may be based on one or more of a command, a command from the set top box, a command from the distribution unit 96, and/or a predetermination. For example, set top box 2 may send a record command to the distribution unit 96 where the record command includes a command to record the 5:30 pm evening news on cable channel 188 on October 18. The distribution unit 96 processes the record command, which may include sending a store command to the video capture unit 158 and/or DS processing unit 16. The video capture unit 158 saves the store command and executes the store command on October 18 at 5:30 pm. The video capture unit 158 selects the content 98 from cable channel 188, receives the content 98, and sends the content 98 to the DS processing unit 16. The DS processing unit 16 determines the record operational parameters based on one or more of a command, a command from the distribution unit 96, an estimated number of store commands received for the same content indicator, a system performance indicator, a memory utilization indicator, a policy indicator, a total population of set top boxes indicator, and a predetermination. Next, the DS processing unit 16 determines which DS units 36 to store the EC data slices and sends the EC data slices 100 with a store command to the selected DS units 36 of the DSN memory 22 for storage therein.

Note that two or more set top boxes may send two or more record commands for the same program of the content 98. The DS processing unit 16 may execute a record function based on receiving the two or more record commands. For example, the DS processing unit 16 may only store EC data slices produced from content 98 in response to receiving at least one record command from at least one set top box. In another example, the distribution unit 96 sends a record command to the DS processing unit 16 based on receiving a first record command for the content 98 and sends nothing to the DS processing unit 16 when the distribution unit 96 receives a second record command for the same content 98. Therefore, in this example, the first record command for a given content portion invokes storing the content 98 as slices 100 to the DSN memory 22 and any other subsequent record commands for the same content 98 do not change the storing of that content 98 as slices 100 in the DSN memory 22. In yet another example, the distribution unit 96 sends the store command to the DS processing unit 16 based on receiving a first or more record commands for the content portion where subsequent record requests may alter the record operational parameters. For instance, the first record command for a given content portion invokes storing the content 98 as EC data slices to the DSN memory 22 and any other subsequent record commands for the same content 98 may change the record operational parameters of that content 98. In a specific example, the DS processing unit 16 starts with a 32/26 system and store slices to pillars 1-27 for the first viewer. The DS processing unit 16 continues to store slices but to pillars 2-28 when the second viewer requests to record the same content portion. The DS processing unit 16 changes a slicing pillar width/read threshold from a 32/26 system to a 40/26 system yet storing to at least 32 pillars of the 40 to realize storing 32 of 40 pillars in some 76 million combinations and still have over 900 thousand combinations to read 26 pillars from the 32 stored pillars when even more viewers request to record the same content portion. The distribution unit 96 and/or DS processing unit 16 changes the record operational parameters prior to or during content capture.

In an example of a record operation, a method begins with a processing module of the DS processing unit receiving a first request to store a program. The processing module receives (e.g., from the video capture unit 158) the program of the content 98. The processing module determines first error coding dispersal storage function parameters and encodes a data segment of the program in accordance with the first error coding dispersal storage function parameters. Such a determination may be based on one or more of previous parameters, predetermined starting point parameters, a command, a set top identifier, and a message. In addition, the processing module may send error coded data slices of the data segment to the DSN memory 22 for storage therein.

The method continues with the step where the processing module determines whether a second request to store the program is received. The processing module encodes a second data segment of the program in accordance with the first error coding dispersal storage function parameters when the second request is not received. The processing module changes the first error coding dispersal storage function parameters based on the second request to produce second error coding dispersal storage function parameters when the second request is received. The processing module changes the first error coding dispersal storage function parameters based on the second request and includes changing a post-slice data manipulation function that includes at least one of an error injection function, a bit dithering function, a bit rotation function, a slice comparison function, a watermark function, a hash function, and a bit swapping function. Next, the processing module encodes the second data segment in accordance with the second error coding dispersal storage function parameters. In addition, the processing module may send error coded data slices of the second data segment to the DSN memory 22 for storage therein.

In addition, the method may continue with the step where the processing module determines whether another request to store the program is received, wherein the other request is received, in time, between the first and second requests. The processing module determines whether to change the first error coding dispersal storage function parameters when the other request is received. The determination may be based on one or more of a requester identifier (e.g., which set top box), previous parameters, a performance indicator, predetermined starting point parameters, a command, and a message. The processing module changes the first error coding dispersal storage function parameters based on the other request to produce third error coding dispersal storage function parameters when the first error coding dispersal storage function parameters are to be changed. Next, the processing module encodes another data segment in accordance with the third error coding dispersal storage function parameters.

Additionally, the processing module may determine a first playback error coding dispersal storage function parameter set for a requesting device associated with the first request based on the first error coding dispersal storage function parameters and subsequent changes to the first error coding dispersal storage function parameters. The processing module determines a second playback error coding dispersal storage function parameter set for a second requesting device associated with the second request based on the second error coding dispersal storage function parameters and subsequent changes to the second error coding dispersal storage function parameters. Next, the processing module outputs the first playback error coding dispersal storage function parameter set to the first requesting device and the processing module outputs the second playback error coding dispersal storage function parameter set to the second requesting device. Note that the first and second error coding dispersal storage function parameters may include one or more of a pillars list, a segmenting protocol, a pre-slice data manipulation function, a forward error correction encoding function, a slicing pillar width, a post-slice data manipulation function, a write threshold, and a read threshold. Note that the pillars list includes at least one set of pillar identifiers associated with less than a slicing pillar width number or at least the read threshold number of a plurality of DS units and at least one set of pillar identifiers associated with less than the slicing pillar width number and at least the read threshold number of the plurality of DS units, wherein the at least one set of pillar identifiers is unique as compared to every other set of pillar identifiers associated with previously determined playback error coding dispersal storage function parameter set for the program. For instance, no other requester (e.g., set top box) utilizes the same pillar combination to retrieve the program.

Note that the encoding method may exclude the use of a unity matrix multiplier (e.g., which typically results in the encoded data in the form of the data+parity information) such that each slice of each pillar is fully calculated from the encoding algorithm (e.g., the output is a mixture of data bits and parity bits). Note that this approach may improve the system reliability when at least one of the pillars is withheld from being stored in accordance with the record operational parameters and in particular when at minimum a read threshold of pillars is stored. Further note that this approach may improve the system security by further disguising the original program data.

The DS processing unit 16, distribution unit 96, and/or storage integrity processing unit may determine if bit errors have occurred in stored slices 100 by examining the contents of slices from time to time or upon data object retrieval to calculate a cyclic redundancy check (CRC) of the slice content and compare it to a previously stored CRC. Equality of the comparison may indicate no errors and inequality may indicate at least one bit error. In an embodiment, the storage integrity processing unit takes action to correct bit errors when they are detected. In another embodiment, the storage integrity processing unit determines what action to take when bit errors are detected based on one or more of the read operational parameters, the media object type (e.g., video, audio, etc) a command, a user vault setting, and/or a system setting. For example, the storage integrity processing unit only flags bit errors (storing in a table or user vault, not correcting the error) when the storage integrity processing unit determines that the media object type is video. Note that the escaping bit errors may be manifested as impairments to the subsequent video playback and may be unique from one set top box to another set top box when each set top box receives the media object where the DS processing receives slices from a unique combination of pillars.

Note that the video capture unit 158, the distribution unit 96 and/or DS processing unit 16 may receive a record command after the program portion of the content 98 has started to be received but before it has all been received (e.g., part way in a real time broadcast). The distribution unit 96 and/or DS processing unit 16 may determine the same or different record operational parameters for a content 98 recording in progress when an incremental record command for that content 98 is received.

In an example of a playback operation, a method begins with a processing module of the DS processing unit receiving a plurality of requests to retrieve a stored program that is stored as a plurality of sets of encoded data slices. The processing module determines playback error coding dispersal storage function parameters based on each request to produce a plurality of determined playback error coding dispersal storage function parameters for each of the plurality of requests. The determination may be based on one or more of the record operational parameters, a command, the number of store commands received for the same program, an estimated number of store commands received for the same content indicator, which combinations of pillars have already been assigned (e.g., the read operational parameters of other viewers), a system performance indicator, a memory utilization indicator, a pillar availability indicator, a policy indicator, a total population of set top boxes indicator, and/or a predetermination.

The processing module determines the DS units 36 based on a program ID and/or the playback error coding dispersal storage function parameters. The processing module processes a first one of the plurality of requests by retrieving a first set of the plurality of sets of encoded data slices from the DS units 36 based on a first one of the plurality of determined playback error coding dispersal storage function parameters. Note that the playback error coding dispersal storage function parameters includes one or more of a pillars list, a segmenting protocol, a pre-slice data manipulation function, a forward error correction encoding function, a slicing pillar width, a write threshold, a read threshold, and a post-slice data manipulation function. The post-slice data manipulation function includes at least one of an error injection function, a bit dithering function, a bit rotation function, a slice comparison function, a watermark function, a hash function, and a bit swapping function. The pillars list includes one of at least one set of pillar identifiers associated with less than a slicing pillar width number and at least the read threshold number of a plurality of DS units, and at least one set of pillar identifiers associated with less than the slicing pillar width number and at least the read threshold number of the plurality of DS units, wherein the at least one set of pillar identifiers is unique as compared to every other set of pillar identifiers associated with previously determined playback error coding dispersal storage function parameter set for the recovered data.

The method continues with the step where the processing module outputs the first set of the plurality of sets of encoded data slices to a first requesting device associated with the first one of the plurality of requests. In an instance of outputting, the processing module decodes the first set of the plurality of sets of encoded data slices based on the first one of the plurality of determined playback error coding dispersal storage function parameters to produce first recovered data and output the first recovered data to the first requesting device associated with the first one of the plurality of requests.

The processing module processes a second one of the plurality of requests by retrieving a second set of the plurality of sets of encoded data slices based on a second one of the plurality of determined playback error coding dispersal storage function parameters. The processing module outputs the second set of the plurality of sets of encoded data slices to a second requesting device associated with the second one of the plurality of requests. In an instance of outputting, the processing module decodes the second set of the plurality of sets of encoded data slices based on the second one of the plurality of determined playback error coding dispersal storage function parameters to produce second recovered data and outputs the second recovered data to the second requesting device associated with the second one of the plurality of requests.

Figure 11:
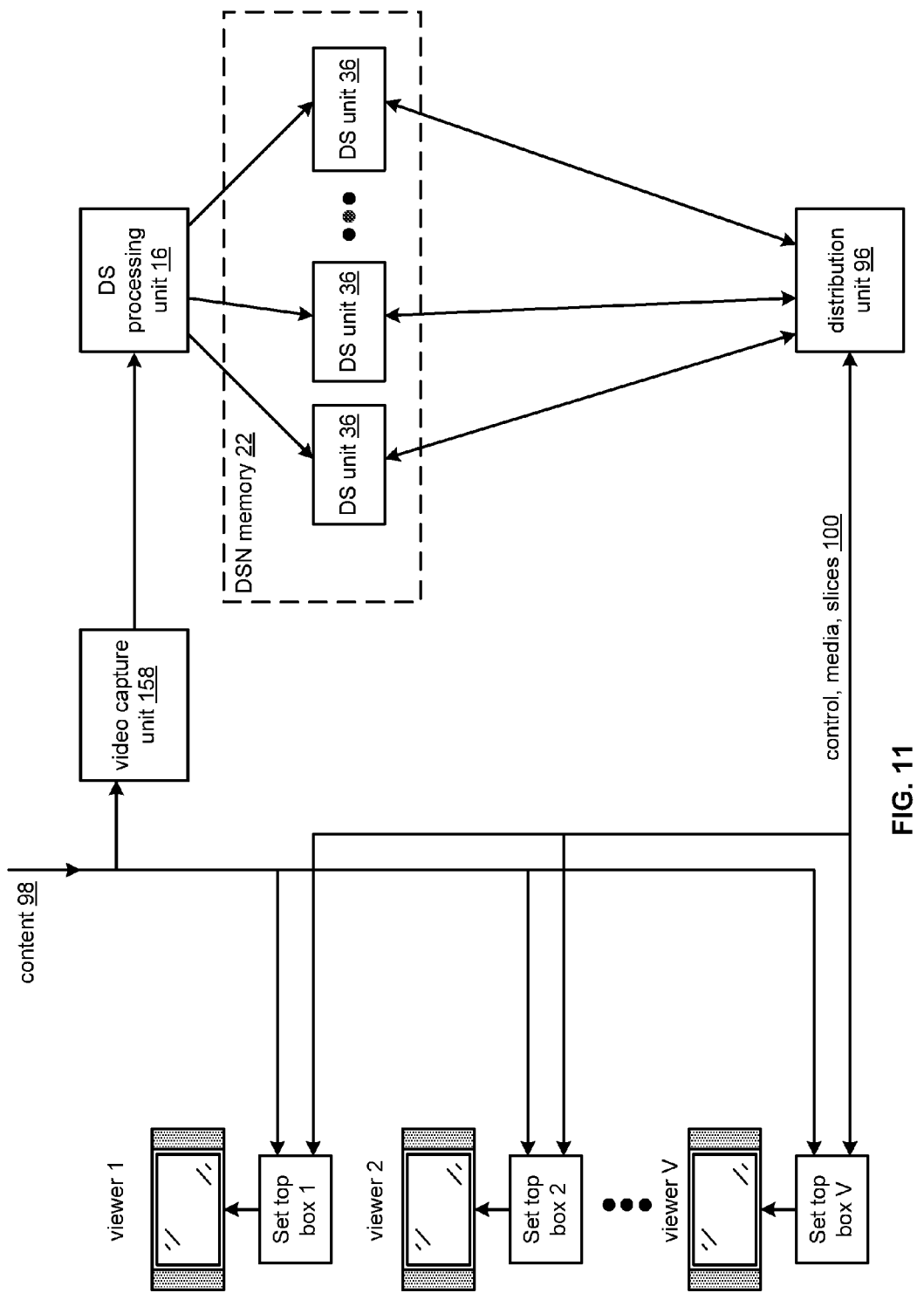
FIG. 11 is a schematic block diagram of another embodiment of a media distribution system in accordance with the invention.

FIG. 11 is a schematic block diagram of another embodiment of a media distribution system. As illustrated, the system includes a plurality of viewers 1-V, a plurality of set top boxes 1-V, a video capture unit 158, a DS processing unit 16, a DSN memory 22, and a distribution unit 96. The plurality of viewers 1-V, the plurality of set top boxes 1-V, the video capture unit 158, the DS processing unit 16, the DSN memory 22, and the distribution unit 96 operate in accordance with, but not limited to, the operations as described previously with reference to FIGS. 6-10.

In an example of operation, a processing module (e.g., of the distribution unit) receives a playback request from a requesting device to access data stored as encoded data slices in the DSN memory 22. The processing module determines playback operational parameters utilizing a static method or a dynamic method. The processing module determines playback operational parameters by retrieving the playback operational parameters from the DSN memory 22 when utilizing the static method. The processing module determines playback operational parameters by generating new playback operational parameters when utilizing the dynamic method as previously discussed. The processing module retrieves encoded data slices of the data in accordance with the playback operational parameters (e.g., retrieving slices from DS units aligned with the playback operational parameters). Note that the processing module may utilize a first collective of playback operational parameters to attempt to retrieve and decode the encoded data slices from the DS units 36. The processing module determines if the slice retrieval and decoding is successful. The processing unit utilizes a second collective of the playback operational parameters to attempt to retrieve and decode the slices 100 when the processing module determines that the attempt with the first collective is not successful. The processing module continues this process until all the assigned collectives of playback operational parameters have been tried.

The processing module may generate at least one additional collective of playback operational parameters when the processing module determines that all of the previously assigned collectives of playback operational parameters have been tried without success (e.g., failure of decoding the data segment from available slices). For example, the processing module generates at least one additional collective of playback operational parameters that is unique with respect to all of the other collectives of playback operational parameters assigned to other requesting devices. In an instance, the requesting device may be assigned four unique combinations of read pillars to utilize to retrieve and decode slices 100. In another example, the processing module generates at least one additional collective of playback operational parameters that is not unique with respect to all of the other collectives of playback operational parameters assigned to other requesting devices. In an instance, the requesting device may be assigned three unique combinations of read pillars and one that is already assigned to another requesting device to utilize to retrieve and decode slices 100. The processing module retrieves, de-slices, and decodes the encoded data slices to produce the media object 100 when a successful combination of read operational parameters is utilized. The processing module sends the slices and/or the media object 100 to the requesting device (e.g., a set top box).

Figure 12:
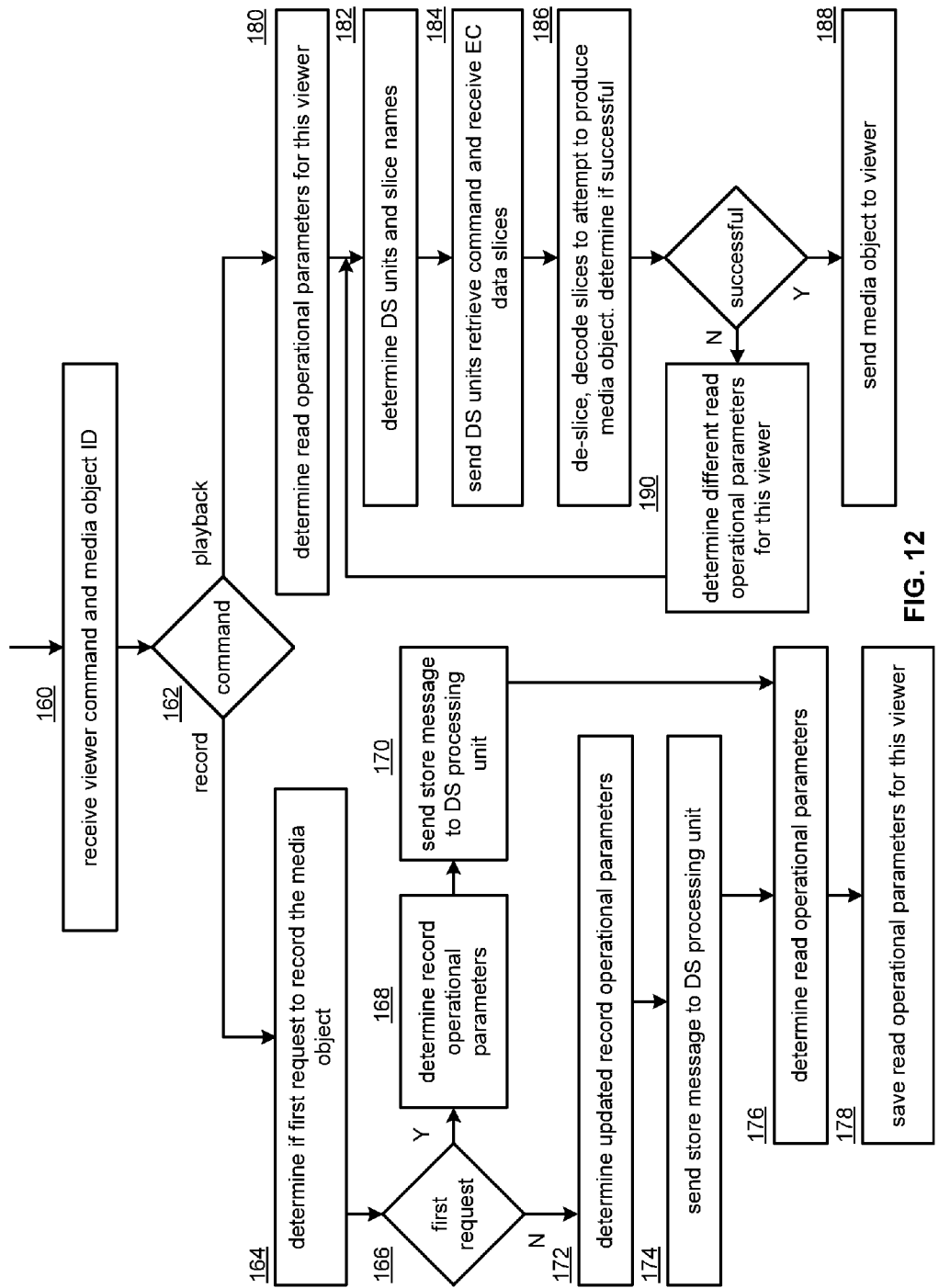
FIG. 12 is another flowchart illustrating another example of recording and playback of media in accordance with the invention.

FIG. 12 is another flowchart illustrating another example of recording and playback of media. The method of steps 160-178 operates as previously discussed with reference to steps 128-146 of FIG. 9.

The processing module (e.g., of a distribution unit 96) receives a plurality of playback requests for data from a plurality of requesting devices, wherein the data is encoded via an error coding dispersal storage function to produce a plurality of sets of encoded data slices which are stored in a dispersed storage network (DSN) memory. At step 180 the processing module determines the read operational parameters for the plurality of playback requests when the processing module determines that the command is the playback command. The processing module determines the read operational parameters by obtaining a plurality of unique retrieval matrixes based on identities of the plurality of requesting devices. The processing module obtains the plurality of unique retrieval matrixes by one of a static method or a dynamic method. In an example of the static method, the processing module retrieves the plurality of unique retrieval matrixes from the DSN memory based on the identities of the plurality of requesting devices (e.g., a lookup of the assignment from a previous playback request or a record request). In an example of the dynamic method, the processing module generates a unique retrieval matrix for each of the plurality of playback requests based on one or more of a failed unique retrieval matrix, the identities of the plurality of requesting devices, the error coding dispersal storage function, a data identifier, a unique retrieval matrix associated with at least one other requesting device, and a unique retrieval matrix functionality indicator. Note that the unique retrieval matrix includes one or more of a pillars list, a segmenting protocol, a pre-slice data manipulation function, a forward error correction encoding function, a slicing pillar width, a post-slice data manipulation function, a write threshold, and a read threshold. Further note that the pillars list includes one of at least one collective of pillar identifiers associated with less than a slicing pillar width number and at least the read threshold number of a plurality of dispersed storage (DS) units associated with the DSN memory or at least one collective of pillar identifiers associated with less than the slicing pillar width number and at least the read threshold number of the plurality of DS units, wherein the at least one collective of pillar identifiers is unique as compared to every other collective of pillar identifiers associated with previously determined unique retrieval matrixes for the same set of the plurality of sets of encoded data slices.

At step 182 the processing module determines the present (e.g., a sequential data segment) plurality of error coded slice names corresponding to the slices of the data by transforming the data ID (e.g., object name) into the slice names. In addition at step 182 the processing module determines DS units based on one or more of the unique retrieval matrix pillars list, the data ID, a translation of the data ID to a virtual DSN address, and a lookup of the virtual DSN address to physical location table. For example, the processing module determines to retrieve from DS units 3, 4, 5, 6, 7, 11, 12, 13, 15, 16 when the unique retrieval matrix pillars list for first collective of error coded data slices includes the pillars corresponding to DS units 3, 4, 5, 6, 7, 11, 12, 13, 15, 16 even when the virtual DSN address to physical location table includes DS units 1-16 for the data.

At step 184 the processing module sends the DS units retrieve slice commands and receives the EC data slices from the DSN memory, a plurality of unique copies of the plurality of sets of encoded data slices in accordance with the plurality of unique retrieval matrixes. For example, the processing module retrieves one set of error coded data slices, corresponding to a data segment, at a time, and retrieves the slices from DS units associated with the pillars of the pillars list from the first unique retrieval matrix associated with the data segment. Additionally, the processing module may output a unique copy of the plurality of unique copies of the plurality of sets of encoded data slices to a corresponding requesting device.

At step 186 the processing module attempts to decode a unique copy of the plurality of unique copies of the plurality of sets of encoded data slices in accordance with the error coding dispersal storage function to produce a unique copy of the data. Additionally, the processing module determines if the unique copy was successfully decoded. The processing module determines that the retrieval is not successful when fewer than a read threshold number of slices are received for any data segment. At step 190 the processing module determines a different combination of read operational parameters (e.g., a different unique retrieval matrix) when the distribution unit determines that the required data segments of the media object have not been successfully recreated (e.g., from a failure such as the DSN memory, network, etc.). Note that the different combination may have already been assigned as retrieved from DSN memory. The processing module may assign at least one new combination of read operational parameters for the requester when the processing module has attempted to utilize all the currently assigned combinations of the read operational parameters without success. In an instance, the processing module assigns the at least one new combination of read operational parameters that is unique from all of the other previously assigned combinations of read operational parameters for all of the requesting devices that have sent the record and/or playback command for the same media object. The method repeats back to step 182 to make another retrieval attempt utilizing the different unique retrieval matrix.

At step 188 the processing module sends the media object to the requester that requested the playback. The media object may be sent whole (all at once as a file) or as a stream. The stream may comprise the media object and/or the slices. In an embodiment, the set top box/viewer includes DS processing to convert the slices into the media object for the viewer. In another embodiment, the set top box/viewer may process the media object sent from the distribution unit including video or audio or video and audio in a real time stream. The set top box/viewer may send flow control commands (e.g., pause, stop, rewind, fast forward, skip backwards, skip forwards, etc.) to the distribution unit such that the distribution unit varies the real time stream in response to the commands.

Figure 13:
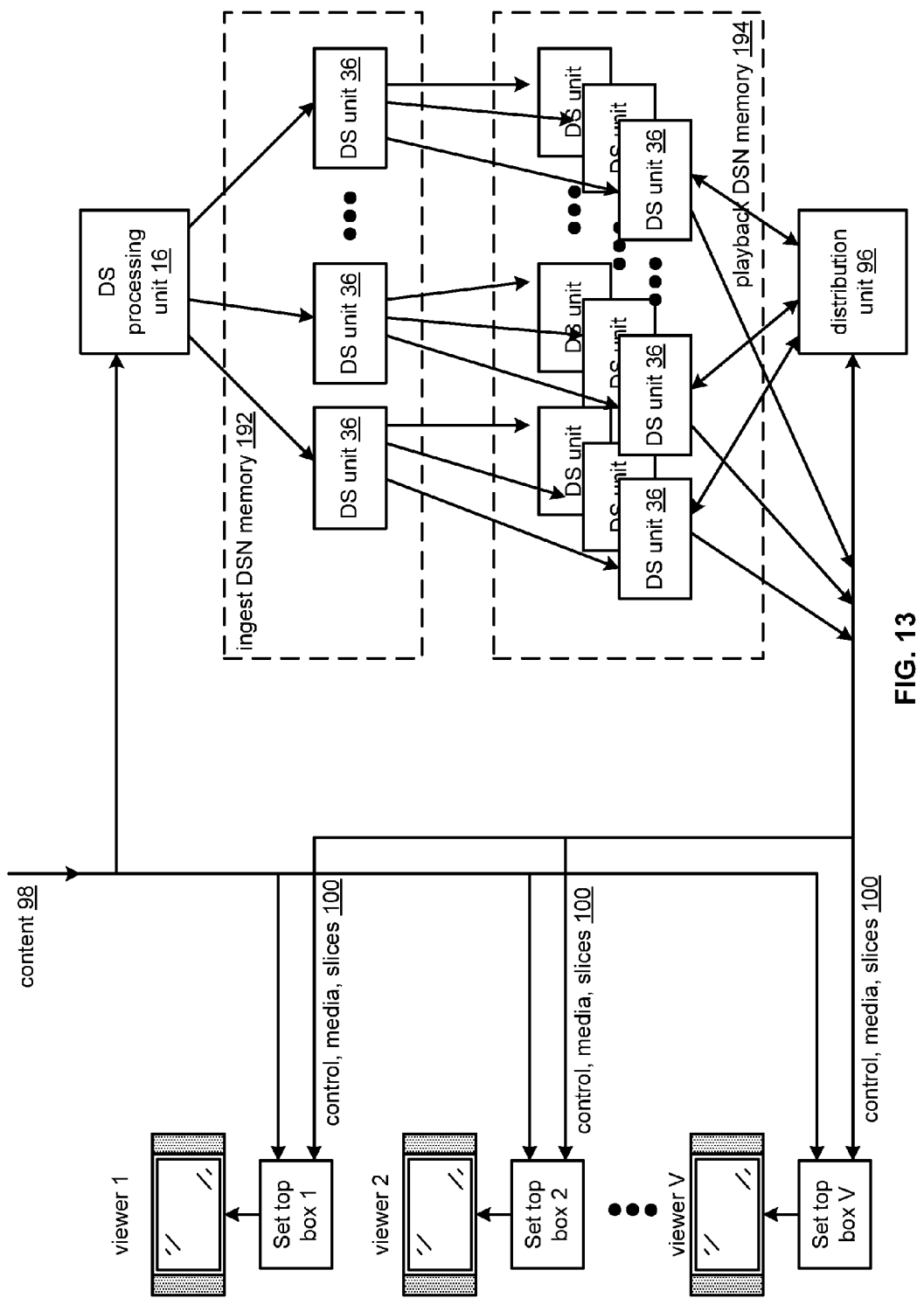
FIG. 13 is a schematic block diagram of another embodiment of a media distribution system in accordance with the invention.

FIG. 13 is a schematic block diagram of an embodiment of a media distribution system. As illustrated, the system includes a plurality of viewers 1-V, a plurality of set top boxes 1-V, a DS processing unit 16, an ingest DSN memory 192, a playback DSN memory 194, and a distribution unit 96.

The distribution unit 96 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). The distribution unit 96 includes a computing core 26, one or more interfaces 30, 32, and/or 33, and may include a DS processing 34.

As illustrated, the viewer may comprise a flat panel television and may include a display and speakers to reproduce the media 100. The viewer may reproduce the media 100 (e.g., video, audio, pictures, web content) output from the set top box.

The set top box includes the computing core 26 and includes the DS processing 34 to receive media slices from the playback DSN memory 194, de-slice, and decode to produce the media 100 for viewing. In addition, the set top boxes 1-V may directly select content 98 (e.g., broadcast/multicast or on-demand video over cable, satellite and/or the internet) and/or may select stored content 98 from the playback DSN memory 194 system via the distribution unit 96. The functions of the set top box and viewer may be integrated together. For example, the viewer (e.g., including set top box functionality) may connect either directly to the playback DSN memory 194 to retrieve media slices 100 or through the distribution unit 96 to receive media 100.

The set top box sends control commands to the distribution unit 96 and/or DS processing unit 16 to control the DS processing unit 16 and/or distribution unit 96. The commands may include one or more of but not limited to record, playback, pause, skip forward, skip backwards, and delete. For example, a set top box may send a record command to the DS processing unit 16. In response, the DS processing unit 16 stores a portion of the content 98 in the ingest DSN memory 192. The set top box may send a playback command to the distribution unit 96. In response, the distribution unit 96 and/or set top box retrieves a portion of the content 98 from the playback DSN memory 194 and sends the portion to the viewer and/or set top box.

To facilitate recording of content 98, the DS processing unit 16 determines which portion (e.g., a media program) of the content 98 to store in the ingest DSN memory 192. The determination may be based on one or more of a command, a command from the set top box, a command from the distribution unit 96, and/or a predetermination. For example, set top box 2 may send a record command to the distribution unit 96 where the record command includes a command to record the 5:30 pm evening news on cable channel 188 on October 18. The distribution unit 96 processes the record command which may include sending a store command to the DS processing unit 16. Next, the DS processing unit 16 saves the store command and executes the store command on October 18 at 5:30 pm. The DS processing unit 16 selects the content 98 from cable channel 188, receives the content 98, determines record operational parameters (e.g., pillar width n, write threshold, encoding method, slicing method, encryption method, etc.), creates a plurality of groups of sets of encoded data slices from the content 98 in accordance with the record operational parameters, and sends the plurality of groups of sets of encoded data slices to the ingest DSN memory 192 for storage. Note that a group of sets of the plurality of groups of sets of encoded data slices corresponds to a time window of the stored program and a set of encoded data slices of the group of sets of the plurality of groups of sets of encoded data slices corresponds to a data segment of the time window. The DS processing unit 16 determines the record operational parameters based on one or more of a command, a command from the distribution unit 96, an estimated number of store commands received for the same content indicator, a system performance indicator, a memory utilization indicator, a policy indicator, a total population of set top boxes indicator, and a predetermination.

Multiple set top boxes may send a record command for the same program. The DS processing unit 16 may only store slices created from content in response to receiving at least one record command from at least one set top box. The distribution unit 96 determines if it has received record commands for the same content (e.g., check a media object table of pending record operations) and processes the record commands in accordance with the determination. The distribution unit 96 sends the store command to the DS processing unit 16 based on receiving a first record command for the content 98 and sends nothing to the DS processing unit 16 when the distribution unit 96 receives a second record command for the same content 98 as the first record command. Therefore, in this example, the first record command for a given content portion invokes storing the content 98 as the plurality of groups of sets of encoded data slices in the ingest DSN memory 192 and any other subsequent record commands for the same content 98 do not change the storing of that content 98 in the ingest DSN memory 192.

Alternatively, the distribution unit 96 sends the store command to the DS processing unit 16 based on receiving a first record command for the content 98 and sends another store command to the DS processing unit 16 when the distribution unit 96 receives a second (or more) record command for the same content as the first record command. The DS processing unit 16 may determine different record operational parameters based on receiving two or more store commands for the same content 98. The determination may be based on one or more of a command, a command from the distribution unit 96, the number of store commands received for the same content 98, a system performance indicator, a memory utilization indicator, a policy indicator, a total population of set top boxes indicator, and/or a predetermination. Note that the distribution unit 96 and/or DS processing unit 16 may receive a record/store command after the content 98 has been started to be received but before it has all been received (e.g., part way in a real time broadcast). The distribution unit 96 and/or DS processing unit 16 may determine the same or different record operational parameters for a content 98 recording in progress when an incremental record command for that content 98 is received.

The distribution unit 96 processes the record command (e.g., from the viewer/set top box) and may include determining read operational parameters for the viewer for this content 98 (e.g., pillar width n of the playback DSN memory 194, what portion of the slices of the media object 100 to have current on the playback DSN memory 194, which particular pillars are allowed to read, read threshold, decoding method, de-slicing method, decryption method, etc.). For example, the read operational parameters may specify that at maximum ten seconds of the media object 100 may be saved in the playback DSN memory 194 per set top box. In an instance, the distribution unit 96 may make the determination when the distribution unit 96 receives the record command. In another instance, the distribution unit 96 may make the determination when the distribution unit 96 receives the playback command. Such a determination may be based on one or more of a current playback position (e.g., how far along in the playback), a command, the number of store commands received for the same content 98, an estimated number of store commands received for the same content indicator, the read operational parameters of other viewers, a system performance indicator, a memory utilization indicator, a playback DSN memory availability indicator, a policy indicator, a total population of set top boxes indicator, and a predetermination. For example, set top box 1 may be assigned read operational parameters to read from pillars 1-10 and set top box 2 may be assigned read operational parameters to read from pillars 3-12 when the playback DSN memory 194 has 16 pillars and a read threshold of 10. The read operational parameters may be utilized in the DS processing (e.g., in the distribution unit 96 and/or the set top box/viewer) to subsequently convert the stored slices 100 from the allowed read pillars into the desired portion of the media content 100.

The viewer/set top box sends a playback command to the distribution unit 96 to invoke the retrieval and conversion of the plurality of groups of sets of encoded data slices from the playback DSN memory 194 into the media object 100. The distribution unit 96 determines if the read operational parameters have been determined for this viewer/set top box based on a lookup (e.g., a media object table and/or user vault). The distribution unit 96 determines the read operational parameters by the lookup when the distribution unit 96 determines that the read operational parameters have been previously determined for this viewer/set top box (e.g., they may have been determined by the distribution unit 96 in response to receiving a record command). The distribution unit 96 determines the read operational parameters when the distribution unit 96 determines that the read operational parameters have not been previously determined for this viewer/set top box. The read operational parameters determination may be based on one or more of the record operational parameters, a command, the number of store commands received for the same content 98, an estimated number of store commands received for the same content indicator, the read operational parameters of other viewers, a playback DSN memory performance indicator, a memory utilization indicator, a pillar availability indicator, a policy indicator, a total population of set top boxes indicator, and a predetermination.

The distribution unit 96 determines the playback DSN memory 194 DS units 36 based on the media object ID and/or the read operational parameters. The distribution unit 96 determines the ingest DSN memory 192 DS units 36 based on the media object ID and/or the record operational parameters. The distribution unit 96 sends a replicate command to the playback DSN memory 194 DS units 36 to replicate slices of the media object 100 from the ingest DSN memory 192 DS units 36 in accordance with the read operational parameters. For example, the playback DSN memory 194 DS units 36 maintain ten seconds (e.g., with respect to real time video) of replicated slices of the media object 100 from the ingest DSN memory 192 DS units 36 by sending a series of slice retrieval commands to the ingest DSN memory 192 DS units 36. The playback DSN memory 194 DS units 36 receive the replicated slices from the ingest DSN memory 192 DS units 36 and store the replicated slices in the playback DSN memory 194 DS units 36. Note that while slices of the entire media object 100 may be stored in the ingest DSN memory 192, only a small portion of the slices 100 of the media object 100 unique to the particular viewer/set top box (e.g., the ten second window preceding the play point) may be present in the playback DSN memory 194 at any one time. Further note that the small portion of slices of the media object 100 are only present in the playback DSN memory 194 in response to a playback command from the viewer/set top box. Yet further note that each viewer/set top box may have its own unique corresponding slices 100 in the playback DSN memory 194.

A DS processing 34 processes a playback command. For example, the processing module of the distribution unit 96 may process the playback command. The method begins with the step where the processing module receives a plurality of playback requests (e.g., from multiple set top boxes) for a stored program, wherein the stored program is stored in a dispersed storage network (DSN) memory (e.g., the ingest DSN memory 192) as a plurality of groups of sets of encoded data slices, wherein a group of sets of the plurality of groups of sets of encoded data slices corresponds to a time window of the stored program and a set of encoded data slices of the group of sets of the plurality of groups of sets of encoded data slices corresponds to a data segment of the time window.

The method continues where the processing module stores a first group of the plurality of groups of sets of encoded data slices in a playback DSN memory to produce a first buffered group in response to each of the plurality of playback requests. The processing module stores the first group in a portion of the playback DSN memory 194 allocated to the requesting device. Alternatively, or in addition to, the processing module may decode the first group of the plurality of groups of sets of encoded data slices in accordance with an error coding dispersal storage function to produce a recaptured first time window. Next, the processing module encodes the recaptured first time window in accordance with a second error coding dispersal storage function to produce a re-encoded first group. Next, the processing module stores the re-encoded first group in the playback DSN memory to produce the first buffered group. In other words, the processing module transcodes the slices.

The method continues where the processing module outputs the first buffered group to a requesting device (e.g., a set top box) corresponding to the each of the plurality of playback requests. Alternatively, or in addition to, the processing module may decode the first group of the plurality of groups of sets of encoded data slices in accordance with an error coding dispersal storage function to produce a first time window of multimedia data and output the first time window of multimedia data to the requesting device.

The method continues where the processing module stores a second group of the plurality of groups of sets of encoded data slices in the playback DSN memory to produce a second buffered group. The processing module stores the second group in the portion of the playback DSN memory 194 allocated to the requesting device. Note that the processing module may store the second group of the plurality of groups of sets of encoded data slices by at least one of overwriting the first buffered group and deleting the first buffered group. In other words, the size of the buffer is maintained. The method continues where the processing module outputs the second buffered group to the requesting device.

The processing module may utilize an alternative method to process a playback command. For example, the method begins where the processing module requests transfer of a first group of a plurality of groups of sets of encoded data slices of the stored program from the dispersed storage network (DSN) memory (e.g., the ingest DSN memory 192) to the playback DSN memory 194, wherein the stored program is stored in the DSN memory as the plurality of groups of sets of encoded data slices, wherein a group of sets of the plurality of groups of sets of encoded data slices corresponds to a time window of the stored program and a set of encoded data slices of the group of sets of the plurality of groups of sets of encoded data slices corresponds to a data segment of the time window. Alternatively, or in addition to, the processing module requests transfer of the first group by decoding the first group of the plurality of groups of sets of encoded data slices in accordance with an error coding dispersal storage function to produce a recaptured first time window. Next, the processing module encodes the recaptured first time window in accordance with a second error coding dispersal storage function to produce a re-encoded first group. Next, the processing module stores the re-encoded first group in the playback DSN memory to produce the first buffered group.

The method continues where the processing module retrieves the first group from the playback DSN memory. Alternatively, or in addition to, the processing module may decode the first group in accordance with an error coding dispersal storage function to produce multimedia data (e.g., for consumption by the viewer). The method continues with the step where the processing module requests transfer of a second group of the plurality of groups of sets of encoded data slices from the ingest DSN memory 192 to the playback DSN memory 194 to produce a second group. Note that the processing module may request transfer of the second group by at least one of overwriting the first group and deleting the first group. The method continues where the processing module retrieves the second group from the playback DSN memory (e.g., for consumption by the viewer).

In addition to the playback methods previously discussed, the processing module may receive other commands to affect the processing of the program. For example, the processing module pauses the storing of the first and second groups for the particular requesting device and flags a most recent outputted group to the particular requesting device to produce a most recent group indicator in response to receiving a pause command from a particular requesting device. In another example, the processing module resumes the storing of the first and second groups for the particular requesting device in accordance with the most recent group indicator in response to receiving a play command from a particular requesting device. In another example, the processing module reverses ordering of the storing of the first and second groups for the particular requesting device in response to receiving a rewind command from a particular requesting device. In another example, the processing module skips the storing of the first group or the second group for the particular requesting device, stores a third group of the plurality of groups of sets of encoded data slices in the playback DSN memory to produce a third buffered group, and outputs the third buffered group to the requesting device in response to receiving a fast forward command from a particular requesting device.

Figure 14:
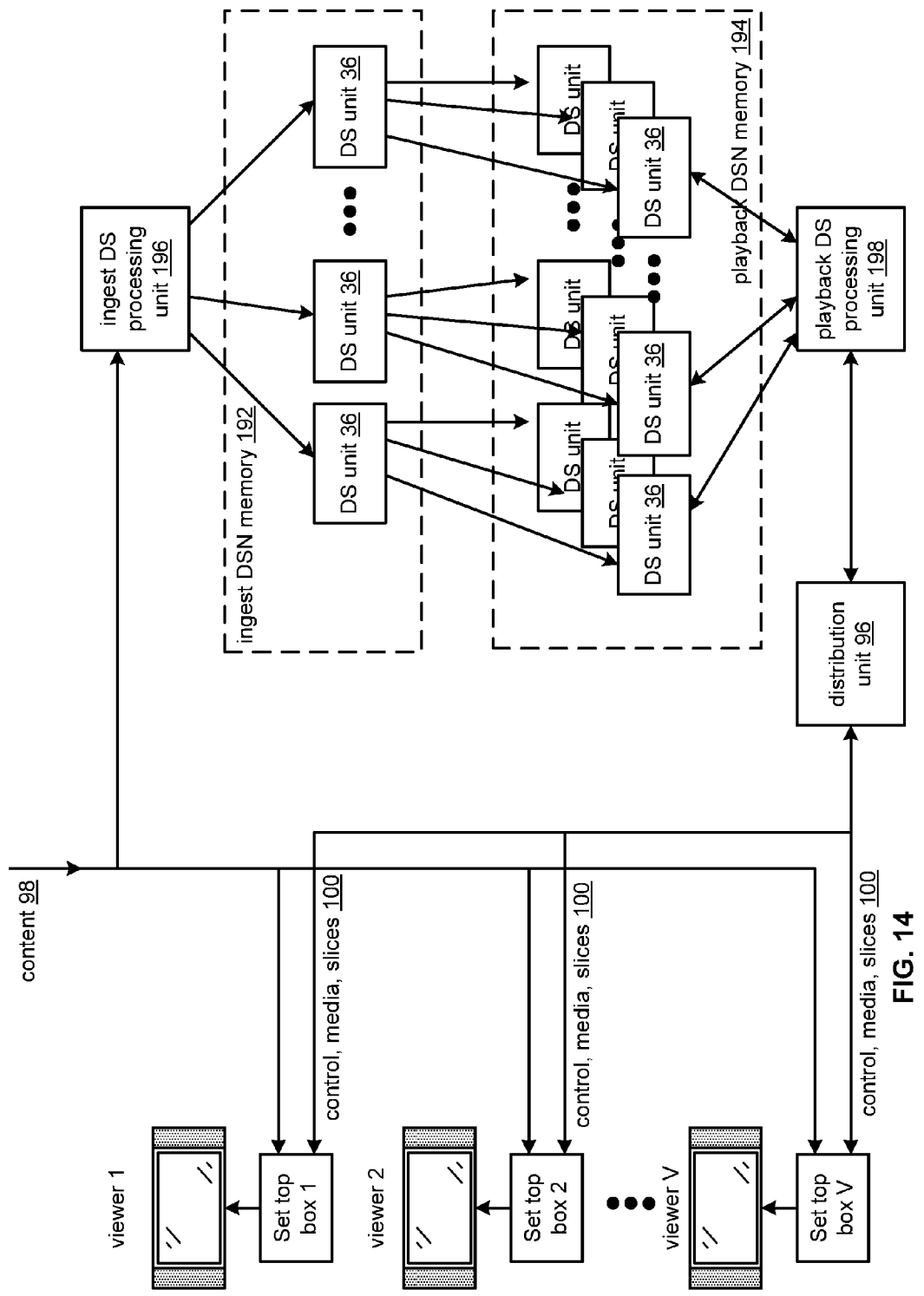
FIG. 14 is a schematic block diagram of another embodiment of a media distribution system in accordance with the invention.

FIG. 14 is a schematic block diagram of an embodiment of a media distribution system. The system includes a plurality of viewers 1-V, a plurality of set top boxes 1-V, an ingest DS processing unit 196, an ingest DSN memory 192, a playback DS processing unit 198, a playback DSN memory 194, and a distribution unit 96.

The viewer may reproduce the media 100 (e.g., video, audio, pictures, web content) output from the set top box. For example, the viewer may comprise a flat panel television and may include a display and speakers to reproduce the media 100.

The set top box may select content 98 (e.g., broadcast/multicast or on-demand video over cable, satellite and/or the internet) and/or stored content 98 from the distributed storage system via the distribution unit 96. The set top box may comprise the computing core of FIG. 2 and in an embodiment may include the DS processing to receive media slices 100 from the playback DSN memory 194, de-slice, and decode to produce the media 100 for viewing. In another embodiment, the set top box receives media from the distribution unit 96 (e.g., the distribution unit 96 utilizes the playback DS processing unit 198 to retrieve media slices, de-slices, and decodes to produce the media 100 for distribution to the set top box and viewer).

In another embodiment, the functions of the set top box and viewer are integrated together. For example, the viewer may connect either directly to the playback DSN memory 194 to retrieve media slices 100 or through the distribution unit 96 to receive media 100.

The set top box sends control commands to the distribution unit 96, playback DS processing unit 198, and/or ingest DS processing unit 196 to invoke media recording and playback. The commands may include, but are not limited to record, playback, pause, skip forward, skip backwards, and delete. For example, the ingest DS processing unit 196 may store a portion of the content 98 in the ingest DSN memory 192 in response to a record command and the distribution unit 96/playback DS processing unit 198 and/or set top box may retrieve a portion of the content 98 from the playback DSN memory 194 and send it to the viewer/set top box in response to receiving a playback command.

The ingest DS processing unit 196 determines which portion of the content 98 to store in the ingest DSN memory 192 for subsequent transfer to the playback DSN memory 194, retrieval and consumption by one or more of the set top boxes based on the received commands. The determination may be based on one or more of a command, a command from the set top box, a command from the distribution unit 96, and/or a predetermination. For example, set top box 2 may send a record command to the distribution unit 96 where the record command includes a command to record the 5:30 pm evening news on cable channel 188 on October 18. The distribution unit 96 processes the record command which may include sending a store command to the ingest DS processing unit 196. The ingest DS processing unit 196 saves the store command and executes the store command on October 18 at 5:30 pm. The ingest DS processing unit 196 selects the content 98 from cable channel 188, receives the content 98, determines the record operational parameters (e.g., pillar width n, write threshold, encoding method, slicing method, encryption method, etc.), creates EC data slices 100 from the content 98 in accordance with the record operational parameters, determines which DS units 36 to store the EC data slices 100, and sends the EC data slices 100 with a store command to the selected DS units 36 of the ingest DSN memory 192 for storage.

The distribution unit 96 and/or ingest DS processing unit 196 determines the record operational parameters based on one or more of a command, a command from the distribution unit 96, an estimated number of store commands received for the same content indicator, a system performance indicator, a memory utilization indicator, a policy indicator, a total population of set top boxes indicator, and/or a predetermination.

Note that multiple set top boxes may send the record command for the same content 98. In an embodiment, the ingest DS processing unit 196 may only store slices 100 created from content 98 in response to receiving at least one record command from at least one set top box. The distribution unit 96 determines if it has received record commands for the same content 98 (e.g., check a media object table of pending record operations) and processes the record commands in accordance with the determination. In an embodiment, the distribution unit 96 sends the store command to the ingest DS processing unit 196 (as discussed previously) based on receiving a first record command for the content 98 and sends nothing to the ingest DS processing unit 196 when the distribution unit 96 receives a second record command for the same content 98 as the first record command. Therefore, in this example, the first record command for a given content portion invokes storing the content 98 as slices 100 to the ingest DSN memory 192 and any other subsequent record commands for the same content 98 do not change the storing of that content 98 as slices 100 in the ingest DSN memory 192.

In an example of operation, the distribution unit 96 sends the store command to the ingest DS processing unit 196 based on receiving a first record command for the content 98 and sends another store command to the ingest DS processing unit 196 when the distribution unit 96 receives a second (or more) record command for the same content 98 as the first record command. The distribution unit 96 and/or ingest DS processing unit 196 determines different record operational parameters based on receiving two or more store commands for the same content 98. Such a determination may be based on one or more of a command, a command from the distribution unit 96, the number of store commands received for the same content 98, a system performance indicator, a memory utilization indicator, a policy indicator, a total population of set top boxes indicator, and a predetermination.

In a mode of operation, the distribution unit 96 and/or the ingest DS processing unit 196 may receive a record/store command after the content 98 has been started to be received but before it has all been received (e.g., part way in a real time broadcast). The distribution unit 96 and/or the ingest DS processing unit 196 determine the same or different record operational parameters for a content recording in progress when an incremental record command for that content 98 is received.

The distribution unit 96 processes the record command (e.g., from the viewer/set top box) and includes determining read operational parameters for the viewer for this content (e.g., pillar width n of the playback DSN memory 194, what portion of the slices of the media object 100 to have current on the playback DSN memory 194, which particular pillars are allowed to read, read threshold, decoding method, de-slicing method, decryption method, etc.). For example, the read operational parameters may specify that at maximum ten seconds of the media object 100 may be saved in the playback DSN memory 194. In an instance, the distribution unit 96 may make the determination when the distribution unit 96 receives the record command. In another instance, the distribution unit 96 may make the determination when the distribution unit 96 receives the playback command. Such a determination may be based on one or more of a current playback position (e.g., how far along in the playback), a command, the number of store commands received for the same content 98, an estimated number of store commands received for the same content indicator, the read operational parameters of other viewers, a system performance indicator, a memory utilization indicator, a playback DSN memory 194 availability indicator, a policy indicator, a total population of set top boxes indicator, and a predetermination. For example, set top box 1 may be assigned read operational parameters to read from pillars 1-10 and set top box 2 may be assigned read operational parameters to read from pillars 3-12 when the playback DSN memory 194 has 16 pillars and a read threshold of 10. The read operational parameters may be utilized in the playback DS processing (e.g., or in the distribution unit and/or the set top box/viewer) to subsequently convert the stored slices 100 from the allowed read pillars into the desired portion of the media content 100.

The viewer/set top box sends a playback command to the distribution unit 96 to invoke the retrieval and conversion of stored slices 100 from the playback DSN memory 194 into the media object 100. The distribution unit 96 determines if the read operational parameters have been determined for this viewer/set top box based on a lookup (e.g., a media object table and/or user vault). The distribution unit 96 determines the read operational parameters by the lookup when the distribution unit 96 determines that the read operational parameters have been previously determined for this viewer/set top box (e.g., they may have been determined by the distribution unit 96 in response to receiving a record command). The distribution unit 96 determines the read operational parameters when the distribution unit 96 determines that the read operational parameters have not been previously determined for this viewer/set top box. The read operational parameters determination may be based on one or more of the record operational parameters, a command, the number of store commands received for the same content 98, an estimated number of store commands received for the same content indicator, the read operational parameters of other viewers, a playback DSN memory performance indicator, a memory utilization indicator, a pillar availability indicator, a policy indicator, a total population of set top boxes indicator, and a predetermination.

The distribution unit 96 determines the playback DSN memory 194 DS units 36 based on the media object ID and/or the read operational parameters. The distribution unit 96 determines the ingest DSN memory 192 DS units 36 based on the media object ID and/or the record operational parameters. The distribution unit 96 and/or playback DS processing unit 198 sends a replicate command to the playback DSN memory 194 DS units 36 to replicate slices of the media object 100 from the ingest DSN memory 192 DS units 36 in accordance with the read operational parameters. For example, the playback DSN memory 194 DS units 36 maintain ten seconds (e.g., with respect to real time video) of replicated slices of the media object 100 from the ingest DSN memory 192 DS units 36 by sending a series of slice retrieval commands to the ingest DSN memory 192 DS units 36. The playback DSN memory 194 DS units 36 receive the replicated slices 100 from the ingest DSN memory 192 DS units 36 and stores the replicated slices 100 in the playback DSN memory 194 DS units 36. Note that while slices of the entire media object 100 may be stored in the ingest DSN memory 192, only a small portion of the slices of the media object 100 unique to the particular viewer/set top box (e.g., the ten second window preceding the play point) may be present in the playback DSN memory 194 at any one time. Further note that the small portion of slices of the media object 100 are only present in the playback DSN memory 194 in response to a playback command from the viewer/set top box. Yet further note that each viewer/set top box may have its own unique corresponding slices in the playback DSN memory 194.

The playback DS processing unit 194 (or distribution unit 96 and/or set top box) retrieves, de-slices, and decodes the replicated slices 100 from the playback DSN memory 194 DS units 36 in accordance with the read operational parameters to produce a media object stream. The distribution unit 96 may delete the replicated slices 100 that were just retrieved from the playback DSN memory 194 DS units 36 and the playback DSN memory 194 DS units 36 may continue to retrieve more replicated slices 100 from the ingest DSN memory 192 DS units 36 in accordance with the read operational parameters (e.g., to maintain ten seconds of real time media object slices 100). The playback DS processing unit 198 sends the media object 100 (batch or stream) to the distribution unit 96. The distribution unit 96 sends the media object stream 100 to the viewer/set top box.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A method for execution by a processing module of a computing device, the method comprises:
   receiving, from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and
   for each of the plurality of playback requests, entering a loop that includes:
      retrieving a group of the plurality of groups of sets of encoded data slices from the DSN memory;
      generating copies of the group of the plurality of groups of sets of encoded data slices, wherein a first copy is generated from first encoded data slices included in the group of the plurality of groups of sets of encoded data slices, and a second copy is generated using second encoded data slices included in the group of the plurality of groups of sets of encoded data slices, and wherein the first encoded data slices are different from the second encoded data slices;
      storing the copies of the group of the plurality of groups of sets of encoded data slices in a playback DSN memory; and
      for each of at least some of the plurality of playback requests, sending a representation of a copy of the copies to a requesting device associated with a corresponding playback request.

2. The method of claim 1, wherein the loop further comprises:
   for each of the at least some of the plurality of playback requests:
      decoding a unique copy of the copies of the plurality of groups of sets of encoded data slices, the unique copy based on at least retrieval with a unique pillar identifier, to generate a group of decoded data segments representing the data within the time window of the stored program; and
      transmitting the group of decoded data segments to a requesting device associated with one of the plurality of playback requests.

3. The method of claim 2, wherein transmitting the group of decoded data segments includes transmitting a media object stream to the requesting device associated with one of the plurality of playback requests.

4. The method of claim 1, further comprising:
   determining which group of the plurality of groups of sets of encoded data slices to retrieve based, at least in part, on a read operational parameter.

5. The method of claim 4, wherein the read operational parameter is determined, based at least in part, on a memory utilization indicator.

6. The method of claim 4, wherein the read operational parameter is determined, based in part, on a pillar availability indicator.

7. The method of claim 1, wherein the generating copies of the group of the plurality of groups of sets of encoded data slices includes generating a number of copies sufficient to generate data segments corresponding to each of the at least some of the plurality of playback requests.

8. A method for execution by a dispersed storage processing module, the method comprises:
   receiving, from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and for each of the plurality of playback requests, entering a loop that includes:
  retrieving a group of the plurality of groups of sets of encoded data slices from the DSN memory;
  decoding the group of the plurality of groups of sets of encoded data slices to generate a group of decoded data segments representing the data within the time window of the stored program, wherein a first decoded data segment of the group of decoded data segments is generated from first encoded data slices included in the group of the plurality of groups of sets of encoded data slices, and a second decoded data segment of the group of decoded data segments is generated using second encoded data slices included in the group of the plurality of groups of sets of encoded data slices, and wherein the first encoded data slices are different from the second encoded data slices;
  making copies of the group of decoded data segments; and
  transmitting the copies of the group of decoded data segments to the plurality of requesting devices associated with the plurality of playback requests.

9. The method of claim 8, further comprising:
determining the group of the plurality of groups of sets to retrieve based, at least in part, on a media object identifier included in the plurality of playback requests.

10. The method of claim 8, further comprising:
determining the group of the plurality of groups of sets to retrieve based, at least in part, on a read operational parameter.

11. The method of claim 10, wherein the read operational parameter is determined, based at least in part, on a system performance indicator.

12. The method of claim 10, wherein the read operational parameter is determined, at least in part based on how many playback requests for the stored program are received.

13. The method of claim 8, wherein making copies of the group of decoded data segments includes making a number of copies corresponding to a number of playback requests included in the plurality of playback requests.

14. A computer comprises:
an interface; and
a processing module operable to:
receive, via the interface from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and for each of the plurality of playback requests, entering a loop that includes:
  retrieving a group of the plurality of groups of sets of encoded data slices from the DSN memory;
  generating copies of the group of the plurality of groups of sets of encoded data slices, wherein a first copy is generated from first encoded data slices included in the group of the plurality of groups of sets of encoded data slices, and a second copy is generated using second encoded data slices included in the group of the plurality of groups of sets of encoded data slices, and wherein the first encoded data slices are different from the second encoded data slices;
  storing the copies of the group of the plurality of groups of sets of encoded data slices in a playback DSN memory; and
  for each of at least some of the plurality of playback requests, sending a representation of a copy of the copies to a requesting device associated with the corresponding playback request.

15. The computer of claim 14, wherein the loop further comprises:
for each of at least some of the plurality of playback requests:
  decoding a unique copy of the copies of the plurality of groups of sets of encoded data, the unique copy based on at least retrieval with a unique pillar identifier, to generate a group of decoded data segments representing the data within the time window of the stored program; and
  transmitting the group of decoded data segments to a requesting device associated with one of the playback requests.

16. The computer of claim 14, further comprising:
determining which group of the plurality of groups of sets to retrieve based, at least in part, on an estimated number of store requests received for a same content item.

17. The computer of claim 14, further comprising:
determining which group of the plurality of groups of sets to retrieve based, at least in part, on a total population of requesting devices.

18. The computer of claim 14, wherein at least some of the groups of the plurality of groups of sets are associated with particular requestors.

19. A computer comprises:
an interface; and
a processing module operable to:
receive, via the interface from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and for each of the plurality of playback requests, perform a loop that includes:
- retrieving, via the interface, a group of the plurality of groups of sets of encoded data slices from the DSN memory;
- decoding the group of the plurality of groups of sets of encoded data slices to generate a group of decoded data segments representing the data within the time window of the stored program, wherein a first decoded data segment of the group of decoded data segments is generated from first encoded data slices included in the group of the plurality of groups of sets of encoded data slices, and a second decoded data segment of the group of decoded data segments is generated using second encoded data slices included in the group of the plurality of groups of sets of encoded data slices, and wherein the first encoded data slices are different from the second encoded data slices;
- making copies of the group of decoded data segments; and
- transmitting the copies of the group of decoded data segments to the plurality of requesting devices associated with the plurality of playback requests.

20. The computer of claim 19, further comprising:
determining which group of the plurality of groups of sets of encoded data slices to retrieve based, at least in part, on a read operational parameter.

21. The computer of claim 20, wherein the read operational parameter is determined, based at least in part, based on a memory utilization indicator.

22. The computer of claim 20, wherein the read operational parameter is determined, based at least in part, on a system performance indicator.

23. The computer of claim 22, wherein the read operational parameter is determined, at least in part based on how many playback requests for the stored program are received.

24. The computer of claim 19, wherein decoding the group of the plurality of groups of sets of encoded data slices is performed based on a read operational parameter.

25. A non-transitory computer readable storage medium storing a program of instructions configured to be executed by a processor to implement a method for execution by a dispersed storage processing module, the program of instructions comprising:
at least one instruction configured to receive, from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and at least one instruction configured to enter a loop for each of the plurality of playback requests, the loop including:
- at least one instruction configured to retrieve a group of the plurality of groups of sets of encoded data slices from the DSN memory;
- at least one instruction configured to generate copies of the group of the plurality of groups of sets of encoded data slices, wherein a first copy is generated from first encoded data slices included in the group of the plurality of groups of sets of encoded data slices, and a second copy is generated using second encoded data slices included in the group of the plurality of groups of sets of encoded data slices, and wherein the first encoded data slices are different from the second encoded data slices;
- at least one instruction configured to store the copies of the group of the plurality of groups of sets of encoded data slices in a playback DSN memory;
- at least one instruction configured, for each of at least some of the plurality of playback requests, to send a representation of a copy of the copies to a requesting device associated with a corresponding playback request; and
- at least one instruction configured to, for each of the at least some of the plurality of playback requests.

26. The non-transitory computer readable storage medium of claim 25, wherein the loop further comprises:
for each of at least some of the plurality of playback requests:
- decoding a unique copy of the copies of the plurality of groups of sets of encoded data, the unique copy based on at least retrieval with a unique pillar identifier, to generate a group of decoded data segments representing the data within the time window of the stored program; and
- transmitting the group of decoded data segments to a requesting device associated with one of the playback requests.

27. The non-transitory computer readable storage medium of claim 26, wherein transmitting the group of decoded data segments includes transmitting a media object stream to the requesting device.

28. The non-transitory computer readable storage medium of claim 25, further comprising:
determining which group of the plurality of groups of sets of encoded data slices to retrieve based, at least in part, on a read operational parameter.

29. The non-transitory computer readable storage medium of claim 28, wherein the read operational parameter is determined, based at least in part, on a memory utilization indicator.

30. The non-transitory computer readable storage medium of claim 28, wherein the read operational parameter is determined, based in part, on a pillar availability indicator.

31. A non-transitory computer readable storage medium storing a program of instructions configured to be executed by a processor to implement a method for execution by a dispersed storage processing module, the program of instructions comprising:
at least one instruction configured to receive, from a plurality of requesting devices, a plurality of playback requests for a stored program, wherein the stored program is encoded via an error coding dispersal storage function to produce a plurality of groups of sets of encoded data slices which are stored in dispersed storage network (DSN) memory, wherein each of the encoded data slices is encoded via the error coding dispersal storage function to not include consecutive bits of a data segment, and wherein a group of sets of the plurality of groups of sets of encoded data slices corresponds to data within a time window of the stored program and a set of encoded data slices of the group of sets of the plurality of groups of sets of encoded data slices corresponds to the data segment of the data within the time window and wherein the set of encoded data slices of the group of sets of the plurality of groups of sets of encoded data slices are encoded via the error coding dispersal storage function to require a threshold number of data slices for decoding; and at least one instruction configured to enter a loop for each of the plurality of playback requests, the loop including:
  at least one instruction configured to retrieve a group of the plurality of groups of sets of encoded data slices from the DSN memory;
  at least one instruction configured to decode the group of the plurality of groups of sets of encoded data slices to generate a group of decoded data segments representing the data within the time window of the stored program, wherein a first decoded data segment of the group of decoded data segments is generated from first encoded data slices included in the group of the plurality of groups of sets of encoded data slices, and a second decoded data segment of the group of decoded data segments is generated using second encoded data slices included in the group of the plurality of groups of sets of encoded data slices, and wherein the first encoded data slices are different from the second encoded data slices;
  at least one instruction to make copies of the group of decoded data segments; and
  at least one instruction configured to transmit the copies of the group of decoded data segments to the plurality of requesting devices associated with the plurality of playback requests.

32. The non-transitory computer readable storage medium of claim 31, further comprising:
  determining the group of the plurality of groups of sets of encoded data slices to retrieve based, at least in part, on a read operational parameter.

33. The non-transitory computer readable storage medium of claim 32, wherein the read operational parameter is determined, based at least in part, on a system performance indicator.

34. The non-transitory computer readable storage medium of claim 32, wherein the read operational parameter is determined, at least in part based on how many playback requests for the stored program are received.

35. The non-transitory computer readable storage medium of claim 31, wherein the at least one instruction configured to transmit the copies of the group of decoded data segments to the plurality of requesting devices associated with the plurality of playback requests includes at least one instruction configured to transmit a media object stream to the plurality of requesting devices.

* * * * *